United States Patent
Yu et al.

(10) Patent No.: US 11,848,776 B2
(45) Date of Patent: Dec. 19, 2023

(54) COMMUNICATION METHOD AND COMMUNICATION APPARATUS FOR SPATIALLY COUPLED CODING

(71) Applicant: Huawei Technologies Co., Ltd., Shenzhen (CN)

(72) Inventors: Hongchen Yu, Beijing (CN); Vladimir Vitalievich Gritsenko, Moscow (RU); Vladislav Nikolaevich Obolentsev, Moscow (RU); Pavel Yakimov, Moscow (RU)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/870,413

(22) Filed: Jul. 21, 2022

(65) Prior Publication Data
US 2022/0385397 A1    Dec. 1, 2022

Related U.S. Application Data

(63) Continuation of application No. PCT/CN2021/070539, filed on Jan. 6, 2021.

(30) Foreign Application Priority Data

Jan. 22, 2020 (RU) .................. RU2020102496

(51) Int. Cl.
  *H04L 1/00* (2006.01)
  *H03M 13/00* (2006.01)
(52) U.S. Cl.
  CPC ........... *H04L 1/0057* (2013.01); *H03M 13/00* (2013.01)
(58) Field of Classification Search
  CPC .................... H04L 1/0057; H03M 13/00
  See application file for complete search history.

(56) References Cited

U.S. PATENT DOCUMENTS

| 6,898,248 B1 * | 5/2005 | Elgamal ............... H04L 1/0048 375/259 |
| 2004/0093549 A1 * | 5/2004 | Song .................. H04L 1/0041 714/752 |

(Continued)

FOREIGN PATENT DOCUMENTS

| CN | 109417432 A | 3/2019 |
| CN | 110419166 A | 11/2019 |
| EP | 3232576 A1 | 10/2017 |

OTHER PUBLICATIONS

ITU-T G.709.3/Y.1331.3, Jun. 2018, "Series G: Transmission Systems and Media,Digital Systems and Networks, Digital terminal equipments—General, Series Y: Global Information Infrastructure, Internet Protocol Aspects, Next-Generation Networks, Internet of Things and Smart Cities, Internet protocol aspects—Transport, Flexible OTN long-reach interfaces," 34 pages.

(Continued)

*Primary Examiner* — Justin R Knapp
(74) *Attorney, Agent, or Firm* — Conley Rose, P.C.

(57) ABSTRACT

A communication method includes obtaining a plurality of to-be-encoded symbols; determining, from a symbol matrix, a plurality of first symbols corresponding to the to-be-encoded symbols, where the symbol matrix includes a plurality of rows of symbols and a plurality of columns of symbols, symbols in the symbol matrix constitute a plurality of blocks, the blocks constitute a block matrix, and the first symbols include symbols in a plurality of first blocks in the block matrix, where the first blocks are grouped into at least one block group, a difference between row numbers of any two first blocks in any block group is not the same as a difference between row numbers of other two first blocks in the any block group; and performing check processing on the first symbols and the to-be-encoded symbols to generate checked symbols.

20 Claims, 6 Drawing Sheets

(56) References Cited

U.S. PATENT DOCUMENTS

2019/0253182 A1    8/2019  Iscan et al.
2020/0021311 A1    1/2020  Yoshida et al.
2022/0376819 A1*  11/2022  Gritsenko ............ H04L 1/0071

OTHER PUBLICATIONS

ITU: "Series G:Transmission Systems and Media, Digital Systems and Networks, Digital sections and digital line system—Optical fibre submarine cable systems, Forward error correction for high bit-rate DWDM submarine systems, Corrigendum 2," 12 pages.

* cited by examiner

COMMUNICATION METHOD AND COMMUNICATION APPARATUS FOR SPATIALLY COUPLED CODING

CROSS-REFERENCE TO RELATED APPLICATION

This is a continuation of International Patent Application No. PCT/CN2021/070539 filed on Jan. 6, 2021, which claims priority to Russian Patent Application No. 2020102496 filed on Jan. 22, 2020. The disclosures of the aforementioned applications are hereby incorporated by reference in their entireties.

TECHNICAL FIELD

Embodiments of this disclosure relate to the field of communication technologies, and in particular, to a communication method and a communication apparatus.

BACKGROUND

In a communication system, channel coding is usually performed to improve data transmission reliability, so as to ensure communication quality.

There is a coding scheme based on spatial coupling (SC). Spatial coupling is a scheme for designing a semi-infinite codeword symbol sequence, so that any symbol in the codeword symbol sequence is included in at least one finite subsequence. These finite subsequences constitute a codeword. In a codeword encoded based on spatial coupling, a component code is formed by interleaving features of a current information block and an earlier generated information block. A new codeword is continuously formed by using an information sequence based on spatial coupling.

With development of communication technologies, a requirement for reducing a bit error rate is increasingly urgent. How to reduce a bit error rate in the coding scheme based on spatial coupling becomes an urgent problem to be resolved in the industry.

SUMMARY

This disclosure provides a communication method and a communication apparatus, to reduce a bit error rate and improve coding performance.

According to a first aspect, a communication method is provided. The communication method includes obtaining a plurality of to-be-encoded symbols, determining, from a symbol matrix, a plurality of first symbols corresponding to the plurality of to-be-encoded symbols, where the symbol matrix includes a plurality of rows of symbols and a plurality of columns of symbols, symbols in the symbol matrix constitute a plurality of blocks, the plurality of blocks constitute a block matrix, each block includes B rows of symbols and B columns of symbols, and the first symbols include symbols in a plurality of first blocks in the block matrix, where the plurality of first blocks are grouped into at least one block group, a difference between row numbers of any two first blocks in any block group is not the same as a difference between row numbers of other two first blocks in the any block group, and B is an integer greater than or equal to 1, and performing check processing on the first symbols and the to-be-encoded symbols to generate checked symbols.

According to the communication method provided in this embodiment of this disclosure, an encoded codeword (or symbols of a codeword) constitutes the symbol matrix. The symbol matrix includes N columns of symbols, the symbols in the symbol matrix constitute the plurality of blocks, the plurality of blocks constitute the block matrix, each block includes the B rows of symbols and the B columns of symbols, and the encoded codeword includes a plurality of component codes. Each component code includes a plurality of first symbols and a plurality of second symbols, the plurality of second symbols are input information symbols corresponding to the component code, and the first symbols include the symbols in the plurality of first blocks in the block matrix. The plurality of first blocks are grouped into the at least one block group, the difference between the row numbers of the any two first blocks in the any block group is not the same as the difference between the row numbers of the other two first blocks in the any block group, and B is an integer greater than or equal to 1. In addition, the plurality of second symbols are in a same row in the symbol matrix, a row of the second symbol further includes the checked symbols, and the checked symbols are generated based on the plurality of first symbols and the plurality of second symbols.

The method may be performed by a transmit end of information or data, and the transmit end may also be referred to as an encoder side. For example, the encoder side may be an encoder side (for example, an optical network device) in a wired communication technology or system such as an optical communication technology or system, or may be an encoder side (for example, a network device or a terminal device) in a wireless communication technology or system.

According to the communication method provided in this embodiment of this disclosure, a short loop in a protograph can be reduced, a bit error rate of decoding can be reduced, and stall-pattern performance can be improved, thereby improving coding performance.

It should be noted that, in this embodiment of this disclosure, B may be an integer greater than or equal to 1. When B=1, each symbol is used as one block in the block matrix.

By way of example rather than limitation, the communication method provided in this disclosure may be applied to a communication system such as an optical communication system.

Optionally, the method further includes storing the to-be-encoded symbols and the checked symbols into a plurality of second blocks, where the second blocks are in a same row of the block matrix.

Optionally, a first block corresponding to a first to-be-encoded symbol in the plurality of to-be-encoded symbols satisfies the following condition:

$$P = R - f(R\%2, [h/B]), \text{ and } f(i, j) = \begin{cases} (a_{L-j} - b - 1) \cdot 2 + 1, i = 0 \\ (b - a_{j+1}) \cdot 2 + 1, i = 1 \end{cases}.$$

P represents a row number of the first block corresponding to the first to-be-encoded symbol, R represents a row number, in the block matrix, of a block into which the first to-be-encoded symbol needs to be stored, h represents a column number of the first to-be-encoded symbol in the symbol matrix, [ ] represents a rounding down operation, a belongs to an integer set A, L represents a quantity of integers included in the integer set A, and the set A may be divided into at least one subset, where a difference between any two integers in any subset is not the same as a difference between other two integers in the any subset.

Optionally, the integer set A is determined based on an integer set A', where a quantity W of integers included in the integer set A' and the integers included in the integer set A' satisfy a correspondence shown in the following first table:

| W | Integer set A' |
|---|---|
| 2 | 0, 1 |
| 3 | 0, 1, 3 |
| 4 | 0, 1, 4, 6 |
| 5 | 0, 1, 4, 9, 11 |
|   | 0, 2, 7, 8, 11 |
| 6 | 0, 1, 4, 10, 12, 17 |
|   | 0, 1, 4, 10, 15, 17 |
|   | 0, 1, 8, 11, 13, 17 |
|   | 0, 1, 8, 12, 14, 17 |
| 7 | 0, 1, 4, 10, 18, 23, 25 |
|   | 0, 1, 7, 11, 20, 23, 25 |
|   | 0, 1, 11, 16, 19, 23, 25 |
|   | 0, 2, 3, 10, 16, 21, 25 |
|   | 0, 2, 7, 13, 21, 22, 25 |
| 8 | 0, 1, 4, 9, 15, 22, 32, 34 |
| 9 | 0, 1, 5, 12, 25, 27, 35, 41, 44 |
| 10 | 0, 1, 6, 10, 23, 26, 34, 41, 53, 55 |
| 11 | 0, 1, 4, 13, 28, 33, 47, 54, 64, 70, 72 |
|   | 0, 1, 9, 19, 24, 31, 52, 56, 58, 69, 72 |
| 12 | 0, 2, 6, 24, 29, 40, 43, 55, 68, 75, 76, 85 |
| 13 | 0, 2, 5, 25, 37, 43, 59, 70, 85, 89, 98, 99, 106 |
| 14 | 0, 4, 6, 20, 35, 52, 59, 77, 78, 86, 89, 99, 122, 127 |
| 15 | 0, 4, 20, 30, 57, 59, 62, 76, 100, 111, 123, 136, 144, 145, 151 |
| 16 | 0, 1, 4, 11, 26, 32, 56, 68, 76, 115, 117, 134, 150, 163, 168, 177 |
| 17 | 0, 5, 7, 17, 52, 56, 67, 80, 81, 100, 122, 138, 159, 165, 168, 191, 199 |
| 18 | 0, 2, 10, 22, 53, 56, 82, 83, 89, 98, 130, 148, 153, 167, 188, 192, 205, 216 |
| 19 | 0, 1, 6, 25, 32, 72, 100, 108, 120, 130, 153, 169, 187, 190, 204, 231, 233, 242, 246 |
| 20 | 0, 1, 8, 11, 68, 77, 94, 116, 121, 156, 158, 179, 194, 208, 212, 228, 240, 253, 259, 283 |
| 21 | 0, 2, 24, 56, 77, 82, 83, 95, 129, 144, 179, 186, 195, 255, 265, 285, 293, 296, 310, 329, 333 |
| 22 | 0, 1, 9, 14, 43, 70, 106, 122, 124, 128, 159, 179, 204, 223, 253, 263, 270, 291, 330, 341, 353, 356 |
| 23 | 0, 3, 7, 17, 61, 66, 91, 99, 114, 159, 171, 199, 200, 226, 235, 246, 277, 316, 329, 348, 350, 366, 372 |
| 24 | 0, 9, 33, 37, 38, 97, 122, 129, 140, 142, 152, 191, 205, 208, 252, 278, 286, 326, 332, 353, 368, 384, 403, 425 |
| 25 | 0, 12, 29, 39, 72, 91, 146, 157, 160, 161, 166, 191, 207, 214, 258, 290, 316, 354, 372, 394, 396, 431, 459, 467, 480 |
| 26 | 0, 1, 33, 83, 104, 110, 124, 163, 185, 200, 203, 249, 251, 258, 314, 318, 343, 356, 386, 430, 440, 456, 464, 475, 487, 492 |
| 27 | 0, 3, 15, 41, 66, 95, 97, 106, 142, 152, 220, 221, 225, 242, 295, 330, 338, 354, 382, 388, 402, 415, 486, 504, 523, 546, 553 |
| 28 | 0, 3, 15, 41, 66, 95, 97, 106, 142, 152, 220, 221, 225, 242, 295, 330, 338, 354, 382, 388, 402, 415, 486, 504, 523, 546, 553, 585 |

Optionally, the integer set A satisfies the following condition:

$$A=\{a_L-a_l|1\le l\le L\},$$

where the integer set A is generated based on an integer set $A'=\{a_1, a_2, \ldots, a_l, \ldots, a_W\}$, where W and the integer set A' satisfy a correspondence shown in a first table.

Optionally, the integer set A satisfies the following condition:

$$A=\{a_1, a_2, \ldots, a_S, \Delta+a_{S+1}, \Delta+a_{S+2}, \ldots, \Delta+a_{2\cdot S}\},$$

where S represents a quantity of columns included in the block matrix, $2\cdot S=L$, and $\Delta$ is a positive integer, and the integer set A is generated based on an integer set $A'=\{a_1, a_2, \ldots, a_l, \ldots, a_W\}$, where W and the integer set A' satisfy a correspondence shown in a first table, or the integer set A is generated based on an integer set $A''=\{a_L-a_l|1\le l\le L\}$, where the integer set A'' is determined based on the integer set A'.

That the integer set A is generated based on an integer set A' may be understood as that a part or all of integers in the integer set A are directly selected from the integer set A'.

Alternatively, that the integer set A is generated based on an integer set A' may be understood as that a part or all of integers in the integer set A are generated by performing an operation on data in the integer set A' according to a specified operation rule (for example, an operation rule corresponding to the integer set A). In the following, to avoid repeated descriptions, descriptions about a same or similar case are omitted.

Optionally, the integer set A satisfies the following condition:

$$A=\{a_1^{(1)}, a_2^{(1)}, \ldots, a_{L_1}^{(1)}, \delta+a_1^{(2)}, \delta+a_2^{(2)}, \ldots, \delta+a_{L_2}^{(2)}\},$$

where $\delta$ is an integer greater than $a_{L_1}^{(1)}$, and $L_1+L_2=L$, and an integer set $A_1=\{a_1^{(1)}, a_2^{(1)}, \ldots, a_{L_1}^{(1)}\}$ is generated based on an integer set $A'=\{a_1, a_2, \ldots, a_l, \ldots, a_W\}$, where W and the integer set A' satisfy a correspondence shown in a first table, the integer set $A_1$ is generated based on an integer set $A''=\{a_L-a_l|1\le l\le L\}$, where the integer set A'' is determined based on the integer set A', or the integer set $A_1$ is generated based on an integer set $A'''=\{a_1, a_2, \ldots, a_S, \Delta+a_{S+1}, \Delta+a_{S+2}, \ldots, \Delta+a_{2\cdot S}\}$, where S represents a quantity of columns included in the block matrix, $2\cdot S=L$, and $\Delta$ is a positive integer, where the integer set A''' is generated based on the integer set A', or the integer set A''' is generated based on the integer set A'', and the integer set A'' is generated based on an integer set A', and an integer set $A_2=\{a_1^{(2)}, a_2^{(2)}, \ldots, a_{L_2}^{(2)}\}$ is generated based on the integer set $A'=\{a_1,$ $a_2, \ldots, a_l, \ldots, a_W$}, where W and the integer set A' satisfy the correspondence shown in the first table, the integer set $A_2$ is generated based on the integer set A"={$a_L-a_l|1\leq l\leq L$}, where the integer set A" is determined based on the integer set A', or the integer set $A_2$ is generated based on the integer set A'''={$a_1, a_2, \ldots, a_S, \Delta+a_{S+1}, \Delta+a_{S+2}, \ldots, \Delta+a_{2\cdot S}$}, where S represents the quantity of columns included in the block matrix, 2·S=L, and $\Delta$ is a positive integer, where the integer set A''' is generated based on the integer set A', or the integer set A''' is generated based on the integer set A", and the integer set A" is generated based on the integer set A'.

Optionally, when R % 2=0 and [k/B]=0, f(R % 2, [k/B])= 51, when R % 2=0 and [k/B]=1, f(R % 2, [k/B])=47, when R % 2=0 and [k/B]=2, f(R % 2, [k/B])=27, when R % 2=0 and [k/B]=3, f(R % 2, [k/B])=13, when R % 2=1 and [k/B]=0, f(R % 2, [k/B])=41, when R % 2=1 and [k/B]=1, f(R % 2, [k/B])=39, when R % 2=1 and [k/B]=2, f(R % 2, [k/B])=33, or when R % 2=1 and [k/B]=3, f(R % 2, [k/B])=23.

Optionally, when R % 2=0 and [k/B]=0, f(R % 2, [k/B])= 31, when R % 2=0 and [1c/B]=1, f(R % 2, [k/B])=29, when R % 2=0 and [k/B]=2, f(R % 2, [k/B])=25, when R % 2=0 and [k/B]=3, f(R % 2, [k/B])=13, when R % 2=1 and [k/B]=0, f(R % 2, [k/B])=45, when R % 2=1 and [k/B]=1, f(R % 2, [k/B])=35, when R % 2=1 and [k/B]=2, f(R % 2, [k/B])=21, or when R % 2=1 and [k/B]=3, f(R % 2, [k/B])=13.

Optionally, when R % 2=0 and [k/B]=0, f(R % 2, [k/B])= 25, when R % 2=0 and [k/B]=1, f(R % 2, [k/B])=23, when R % 2=0 and [k/B]=2, f(R % 2, [k/B])=17, when R % 2=0 and [k/B]=3, f(R % 2, [k/B])=13, when R % 2=1 and [k/B]=0, f(R % 2, [k/B])=25, when R % 2=1 and [k/B]=1, f(R % 2, [k/B])=23, when R % 2=1 and [k/B]=2, f(R % 2, [k/B])=17, or when R % 2=1 and [k/B]=3, f(R % 2, [k/B])=13.

According to a second aspect, a communication method is provided. The communication method includes obtaining a plurality of to-be-decoded symbols, where the plurality of to-be-decoded symbols include a plurality of checked symbols and a plurality of information symbols, determining, from a symbol matrix, a plurality of first symbols corresponding to the plurality of to-be-decoded symbols, where the symbol matrix includes a plurality of rows of symbols and a plurality of columns of symbols, symbols in the symbol matrix constitute a plurality of blocks, the plurality of blocks constitute a block matrix, each block includes B rows of symbols and B columns of symbols, and the first symbols include symbols in a plurality of first blocks in the block matrix, where the plurality of first blocks are grouped into at least one block group, a difference between row numbers of any two first blocks in any block group is not the same as a difference between row numbers of other two first blocks in the any block group, B is an integer greater than or equal to 1, and the checked symbols are generated based on the first symbols and the information symbols, and restoring the information symbols from the to-be-decoded symbols based on the first symbols and the checked symbols.

According to the communication method provided in this embodiment of this disclosure, a short loop in a protograph can be reduced, a bit error rate of decoding can be reduced, and stall-pattern performance can be improved, thereby improving coding performance.

It should be noted that, in this embodiment of this disclosure, B may be an integer greater than or equal to 1. When B=1, each symbol is used as one block in the block matrix.

The method may be performed by a receive end of information or data, and the receive end may also be referred to as a decoder side. For example, the decoder side may be a decoder side (for example, an optical network device) in a wired communication technology or system such as an optical communication technology or system, or may be a decoder side (for example, a network device or a terminal device) in a wireless communication technology or system.

Optionally, the method further includes storing the to-be-decoded symbols into a plurality of second blocks, where the second blocks are in a same row of the block matrix.

Optionally, a first block corresponding to a first to-be-decoded symbol in the plurality of to-be-decoded symbols satisfies the following condition:

$$P = R - f(R\%2, [h/B]), \text{ and } f(i, j) = \begin{cases} (a_{L-j} - b - 1) \cdot 2 + 1, i = 0 \\ (b - a_{j+1}) \cdot 2 + 1, i = 1 \end{cases}.$$

P represents a row number of the first block corresponding to the first to-be-decoded symbol, R represents a row number, in the block matrix, of a block into which the first to-be-decoded symbol needs to be stored, h represents a column number of the first to-be-decoded symbol in the symbol matrix, [ ] represents a rounding down operation, a belongs to an integer set A, L represents a quantity of integers included in the integer set A, and the set A includes at least one subsets, where a difference between any two integers in any subset is not the same as a difference between other two integers in the any subset.

Optionally, the integer set A is determined based on an integer set A', where a quantity W of integers included in the integer set A' and the integers included in the integer set A' satisfy a correspondence shown in the foregoing first table.

Optionally, the integer set A satisfies the following condition:

$A=\{a_L-a_l|1\leq l\leq L\}$, where the integer set A is generated based on an integer set A'={$a_1, a_2, \ldots, a_l, \ldots, a_W$}, where W and the integer set A' satisfy a correspondence shown in a first table.

Optionally, the integer set A satisfies the following condition:

$A=\{a_1,a_2,\ldots,a_S,\Delta+a_{S+1},\Delta+a_{S+2},\ldots,\Delta+a_{2\cdot S}\}$, where S represents a quantity of columns included in the block matrix, 2·S=L, and $\Delta$ is a positive integer, and the integer set A is generated based on an integer set A'={$a_1, a_2, \ldots, a_l, \ldots, a_W$}, where W and the integer set A' satisfy a correspondence shown in a first table, or the integer set A is generated based on an integer set A"={$a_L-a_l|1\leq l\leq L$}, where the integer set A" is determined based on the integer set A'.

Optionally, the integer set A satisfies the following condition:

$A=\{a_1^{(1)},a_2^{(1)},\ldots,a_{L_1}^{(1)},\delta+a_1^{(2)},\delta+a_2^{(2)},\ldots,\delta+a_{L_2}^{(2)}\}$, where $\delta$ is an integer greater than $a_{L_1}^{(1)}$, and $L_1+L_2=L$, and an integer set $A_1=\{a_1^{(1)}, a_2^{(1)}, \ldots, a_L^{(1)}\}$ is generated based on an integer set A'={$a_1, a_2, \ldots, a_l, \ldots, a_W$}, where W and the integer set A' satisfy a correspondence shown in a first table, the integer set $A_1$ is generated based on an integer set A"={$a_L-a_l|1\leq l\leq L$}, where the integer set A" is determined based on the integer set A', or the integer set $A_1$ is generated based on an integer set A'''={$a_1, a_2, \ldots, a_S, \Delta+a_{S+1}, \Delta+a_{S+2}, \ldots, \Delta+a_{2\cdot S}$}, where S represents a quantity of columns included in the block matrix, 2·S=L, and Δ is a positive integer, where the integer set A''' is generated based on the integer set A', or the integer set A''' is generated based on the integer set A", and the integer set A" is generated based on an integer set A', and an integer set $A_2=\{a_1^{(2)}, a_2^{(2)}, \ldots, a_{L_2}^{(2)}\}$ is generated based on an integer set A'={$a_1, a_2, \ldots, a_l, \ldots, a_W$}, where W and the integer set A' satisfy the correspondence shown in the first table, the integer set $A_2$ is generated based on the integer set A"={$a_L-a_l|1 \leq l \leq L$}, where the integer set A" is determined based on the integer set A', or the integer set $A_2$ is generated based on the integer set A'''={$a_1, a_2, \ldots, a_S, \Delta+a_{S+1}, \Delta+a_{S+2}, \ldots, \Delta+a_{2\cdot S}$}, where S represents the quantity of columns included in the block matrix, 2·S=L, and A is a positive integer, where the integer set A''' is generated based on the integer set A', or the integer set A''' is generated based on the integer set A", and the integer set A" is generated based on the integer set A'.

Optionally, when R % 2=0 and [k/B]=0, f(R % 2, [k/B])=51, when R % 2=0 and [k/B]=1, f(R % 2, [k/B])=47, when R % 2=0 and [k/B]=2, f(R % 2, [k/B])=27, when R % 2=0 and [k/B]=3, f(R % 2, [k/B])=13, when R % 2=1 and [k/B]=0, f(R % 2, [k/B])=41, when R % 2=1 and [k/B]=1, f(R % 2, [k/B])=39, when R % 2=1 and [k/B]=2, f(R % 2, [k/B])=33, or when R % 2=1 and [k/B=3, f(R % 2, [k/B])=23.

Optionally, when R % 2=0 and [k/B]=0, f(R % 2, [k/B])=31, when R % 2=0 and [k/B]=1, f(R % 2, [k/B])=29, when R % 20 and [k/B]=2, f(R % 2, [k/B])=25, when R % 2=0 and [k/B]=3, f(R % 2, [k/B])=13, when R % 2=1 and [k/B]=0, f(R % 2, [k/B])=45, when R % 2=1 and [k/B]=1, f(R % 2, [k/B])=35, when R % 2=1 and [k/B]=2, f(R % 2, [k/B])=21, or when R % 2=1 and [k/B]=3, f(R % 2, [k/B])=13.

Optionally, when R % 2=0 and [k/B]=0, f(R % 2, [k/B])=25, when R % 2=0 and [k/B]=1, f(R % 2, [k/B])=23, when R % 2=0 and [k/B]=2, f(R % 2, [k/B])=17, when R % 2=0 and [k/B]=3, f(R % 2, [k/B])=13, when R % 2=1 and [k/B]=0, f(R % 2, [k/B])=25, when R % 2=1 and [k/B]=1, f(R % 2, [k/B])=23, when R % 2=1 and [k/B]=2, f(R % 2, [k/B])=17, or when R % 2=1 and [k/B]=3, f(R % 2, [k/B])=13.

According to a third aspect, a communication apparatus is provided. The communication apparatus includes an input interface configured to input a plurality of to-be-encoded symbols, and a processing unit configured to determine, from a symbol matrix, a plurality of first symbols corresponding to the plurality of to-be-encoded symbols, where the symbol matrix includes a plurality of rows of symbols and a plurality of columns of symbols, symbols in the symbol matrix constitute a plurality of blocks, the plurality of blocks constitute a block matrix, each block includes B rows of symbols and B columns of symbols, and the first symbols include symbols in a plurality of first blocks in the block matrix, where the plurality of first blocks are grouped into at least one block group, a difference between row numbers of any two first blocks in any block group is not the same as a difference between row numbers of other two first blocks in the any block group, and B is an integer greater than or equal to 1, and perform check processing on the first symbols and the to-be-encoded symbols to generate checked symbols.

According to the communication apparatus provided in this embodiment of this disclosure, an encoded codeword (or symbols of a codeword) constitutes the symbol matrix. The symbol matrix includes N columns of symbols, the symbols in the symbol matrix constitute the plurality of blocks, the plurality of blocks constitute the block matrix, each block includes the B rows of symbols and the B columns of symbols, and the encoded codeword includes a plurality of component codes. Each component code includes a plurality of first symbols and a plurality of second symbols, the plurality of second symbols are input information symbols corresponding to the component code, and the first symbols include the symbols in plurality of first blocks in the block matrix. The plurality of first blocks are grouped into the at least one block group, the difference between the row numbers of the any two first blocks in the any block group is not the same as the difference between the row numbers of the other two first blocks in the any block group, and B is an integer greater than or equal to 1. In addition, the plurality of second symbols are in a same row in the symbol matrix, a row of the second symbol further includes the checked symbols, and the checked symbols are generated based on the plurality of first symbols and the plurality of second symbols.

The communication apparatus provided in this embodiment of this disclosure can reduce a short loop in a protograph and a bit error rate of decoding, and can improve stall-pattern performance, thereby improving coding performance.

It should be noted that, in this embodiment of this disclosure, B may be an integer greater than or equal to 1. When B=1, each symbol is used as one block in the block matrix.

Optionally, the processing unit is further configured to store the to-be-encoded symbols and the checked symbols into a plurality of second blocks, where the second blocks are in a same row of the block matrix.

Optionally, a first block corresponding to a first to-be-encoded symbol in the plurality of to-be-encoded symbols satisfies the following condition:

$$P = R - f(R\%2, [h/B]), \text{ and } f(i, j) = \begin{cases} (a_{L-j} - b - 1) \cdot 2 + 1, i = 0 \\ (b - a_{j+1}) \cdot 2 + 1, i = 1 \end{cases}.$$

P represents a row number of the first block corresponding to the first to-be-encoded symbol, R represents a row number, in the block matrix, of a block into which the first to-be-encoded symbol needs to be stored, h represents a column number of the first to-be-encoded symbol in the symbol matrix, [ ] represents a rounding down operation, a belongs to an integer set A, L represents a quantity of integers included in the integer set A, and a difference between any two integers in the set A is not the same as a difference between other two integers in the set A.

Optionally, the integer set A is determined based on an integer set A', where a quantity W of integers included in the integer set A' and the integers included in the integer set A' satisfy a correspondence shown in the foregoing first table.

Optionally, the integer set A satisfies the following condition:

$A = \{a_L - a_l | 1 \leq l \leq L\}$, where the integer set A is generated based on an integer set A'={$a_1, a_2, \ldots, a_l, \ldots, a_W$}, where W and the integer set A' satisfy a correspondence shown in a first table.

Optionally, the integer set A satisfies the following condition:

$A = \{a_1, a_2, \ldots, a_S, \Delta + a_{S+1}, \Delta + a_{S+2}, \ldots, \Delta + a_{2 \cdot S}\}$, where S represents a quantity of columns included in the block matrix, 2·S=L, and A is a positive integer, and the integer set A is generated based on an integer set A'={$a_1, a_2, \ldots, a_l, \ldots, a_W$}, where W and the integer set A' satisfy a correspondence shown in a first table, or the integer set A is generated based on an integer set $A''=\{a_L-a_l|1\leq l\leq L\}$, where the integer set A" is determined based on the integer set A'.

Optionally, the integer set A satisfies the following condition:

$$A=\{a_1^{(1)},a_2^{(1)},\ldots,a_L^{(1)},\delta+a_1^{(2)},\delta+a_2^{(2)},\ldots,\delta+a_{L_2}^{(2)}\},$$

where δ is an integer greater than $a_{L_1}^{(1)}$, and $L_1+L_2=L$, and an integer set $A_1=\{a_1^{(1)}, a_2^{(1)}, \ldots, a_L^{(1)}\}$ is generated based on an integer set $A'=\{a_1, a_2, \ldots, a_l, \ldots a_W\}$, where W and the integer set A' satisfy the correspondence shown in the first table, the integer set $A_1$ is generated based on an integer set $A''=\{a_L-a_l|1\leq l\leq L\}$, where the integer set A" is determined based on the integer set A', or the integer set $A_1$ is generated based on an integer set $A'''=\{a_1, a_2, \ldots, a_S, \Delta+a_{S+1}, \Delta+a_{S+2}, \ldots, \Delta+a_{2\cdot S}\}$, where S represents a quantity of columns included in the block matrix, 2·S=L, and Δ is a positive integer, where the integer set A''' is generated based on the integer set A', or the integer set A''' is generated based on the integer set A", and the integer set A" is generated based on an integer set A', and an integer set $A_2=\{a_1^{(2)}, a_2^{(2)}, \ldots, a_{L_2}^{(2)}\}$ is generated based on the integer set $A'=\{a_1, a_2, \ldots, a_l, \ldots, a_W\}$, where W and the integer set A' satisfy the correspondence shown in the first table, the integer set $A_2$ is generated based on the integer set $A''=\{a_L-a_l|1\leq l\leq L\}$, where the integer set A" is determined based on the integer set A', or the integer set $A_2$ is generated based on the integer set $A'''=\{a_1, a_2, \ldots, a_S, \Delta+a_{S+1}, \Delta+a_{S+2}, \ldots, \Delta+a_{2\cdot S}\}$, where S represents the quantity of columns included in the block matrix, 2·S=L, and Δ is a positive integer, where the integer set A''' is generated based on the integer set A', or the integer set A''' is generated based on the integer set A", and the integer set A" is generated based on the integer set A'.

Optionally, when R % 2=0 and [k/B]=0, f(R % 2, [k/B])=51, when R % 2=0 and [k/B]=1, f(R % 2, [k/B])=47, when R % 2=0 and [k/B]=2, f(R % 2, [k/B])=27, when R % 2=0 and [k/B]=3, f(R % 2, [k/B])=13, when R % 2=1 and [k/B]=0, f(R % 2, [k/B])=41, when R % 2=1 and [k/B]=1, f(R % 2, [k/B])=39, when R % 2=1 and [k/B]=2, f(R % 2, [k/B])=33, or when R % 2=1 and [k/B=3, f(R % 2, [k/B])=23.

Optionally, when R % 2=0 and [k/B]=0, f(R % 2, [k/B])=31, when R % 2=0 and [k/B]=1, f(R % 2, [k/B])=29, when R % 20 and [k/B]=2, f(R % 2, [k/B])=25, when R % 2=0 and [k/B]=3, f(R % 2, [k/B])=13, when R % 2=1 and [k/B]=0, f(R % 2, [k/B])=45, when R % 2=1 and [k/B]=1, f(R % 2, [k/B])=35, when R % 2=1 and [k/B]=2, f(R % 2, [k/B])=21, or when R % 2=1 and [k/B]=3, f(R % 2, [k/B])=13.

Optionally, when R % 2=0 and [k/B]=0, f(R % 2, [k/B])=25, when R % 2=0 and [k/B]=1, f(R % 2, [k/B])=23, when R % 2=0 and [k/B]=2, f(R % 2, [k/B])=17, when R % 2=0 and [k/B]=3, f(R % 2, [k/B])=13, when R % 2=1 and [k/B]=0, f(R % 2, [k/B])=25, when R % 2=1 and [k/B]=1, f(R % 2, [k/B])=23, when R % 2=1 and [k/B]=2, f(R % 2, [k/B])=17, or when R % 2=1 and [k/B]=3, f(R % 2, [k/B])=13.

According to a fourth aspect, a communication apparatus is provided. The communication apparatus includes an input unit configured to input a plurality of to-be-decoded symbols, where the plurality of to-be-decoded symbols include a plurality of checked symbols and a plurality of information symbols, and a processing unit configured to determine, from a symbol matrix, a plurality of first symbols corresponding to the plurality of to-be-decoded symbols, where the symbol matrix includes a plurality of rows of symbols and a plurality of columns of symbols, symbols in the symbol matrix constitute a plurality of blocks, the plurality of blocks constitute a block matrix, each block includes B rows of symbols and B columns of symbols, and the first symbols include symbols in a plurality of first blocks in the block matrix, where the plurality of first blocks are grouped into at least one block group, a difference between row numbers of any two first blocks in any block group is not the same as a difference between row numbers of other two first blocks in the any block group, B is an integer greater than or equal to 1, and the checked symbols are generated based on the first symbols and the information symbols, and restore the information symbols from the to-be-decoded symbols based on the first symbols and the checked symbols.

The communication apparatus provided in this embodiment of this disclosure can reduce a short loop in a protograph and a bit error rate of decoding, and can improve stall-pattern performance, thereby improving coding performance.

It should be noted that, in this embodiment of this disclosure, B may be an integer greater than or equal to 1. When B=1, each symbol is used as one block in the block matrix.

Optionally, the processing unit is further configured to store the to-be-decoded symbols into a plurality of second blocks, where the second blocks are in a same row of the block matrix.

Optionally, a first block corresponding to a first to-be-decoded symbol in the plurality of to-be-decoded symbols satisfies the following condition:

$$P = R - f(R\%2, [h/B]), \text{ and } f(i, j) = \begin{cases} (a_{L-j} - b - 1)\cdot 2 + 1, i = 0 \\ (b - a_{j+1})\cdot 2 + 1, i = 1 \end{cases}.$$

P represents a row number of the first block corresponding to the first to-be-decoded symbol, R represents a row number, in the block matrix, of a block into which the first to-be-decoded symbol needs to be stored, h represents a column number of the first to-be-decoded symbol in the symbol matrix, [ ] represents a rounding down operation, a belongs to an integer set A, L represents a quantity of integers included in the integer set A, and the set A includes at least two subsets, where a difference between any two integers in any subset is not the same as a difference between other two integers in the any subset.

Optionally, the integer set A is determined based on an integer set A', where a quantity W of integers included in the integer set A' and the integers included in the integer set A' satisfy a correspondence shown in the foregoing first table.

Optionally, the integer set A satisfies the following condition:

$$A=\{a_L-a_l|1\leq l\leq L\},$$

where the integer set A is generated based on an integer set $A'=\{a_1, a_2, \ldots, a_l, \ldots, a_W\}$, where W and the integer set A' satisfy a correspondence shown in a first table.

Optionally, the integer set A satisfies the following condition:

$$A=\{a_1,a_2,\ldots,a_S,\Delta+a_{S+1},\Delta+a_{S+2},\ldots,\Delta+a_{2\cdot S}\},$$

where S represents a quantity of columns included in the block matrix, 2·S=L, and Δ is a positive integer, and the integer set A is generated based on an integer set $A'=\{a_1, a_2, \ldots, a_l, \ldots, a_W\}$, where W and the integer set A' satisfy a correspondence shown in a first table, or the integer set A is generated based on an integer set $A''=\{a_L-a_l|1\leq l\leq L\}$, where the integer set $A''$ is determined based on the integer set $A'$.

Optionally, the integer set A satisfies the following condition:

$$A=\{a_1^{(1)}, a_2^{(1)}, \ldots, a_{L_1}^{(1)}, \delta+a_1^{(2)}, \delta+a_2^{(2)}, \ldots, \delta+a_{L_2}^{(2)}\},$$

where $\delta$ is an integer greater than $a_{L_1}^{(1)}$, and $L_1+L_2=L$, and an integer set $A_1=\{a_1^{(1)}, a_2^{(1)}, \ldots, a_{L_1}^{(1)}\}$ is generated based on an integer set $A'=\{a_1, a_2, \ldots, a_l, \ldots, a_W\}$, where W and the integer set $A'$ satisfy a correspondence shown in a first table, the integer set $A_1$ is generated based on an integer set $A''=\{a_L-a_l|1\leq l\leq L\}$, where the integer set $A''$ is determined based on the integer set $A'$, or the integer set $A_1$ is generated based on an integer set $A'''=\{a_1, a_2, \ldots, a_S, \Delta+a_{S+1}, \Delta+a_{S+2}, \ldots, \Delta+a_{2\cdot S}\}$, where S represents a quantity of columns included in the block matrix, $2\cdot S=L$, and $\Delta$ is a positive integer, where the integer set $A'''$ is generated based on the integer set $A'$, or the integer set $A'''$ is generated based on the integer set $A''$, and the integer set $A''$ is generated based on an integer set $A'$, and an integer set $A_2=\{a_1^{(2)}, a_2^{(2)}, \ldots, a_{L_2}^{(2)}\}$ is generated based on an integer set $A'=\{a_1, a_2, \ldots, a_l, \ldots a_W\}$, where W and the integer set $A'$ satisfy a correspondence shown in a first table, the integer set $A_2$ is generated based on an integer set $A''=\{a_L-a_l|1\leq l\leq L\}$, where the integer set $A''$ is determined based on the integer set $A'$, or the integer set $A_2$ is generated based on the integer set $A'''=\{a_1, a_2, \ldots, a_S, \Delta+a_{S+1}, \Delta+a_{S+2}, \ldots, \Delta+a_{2\cdot S}\}$, where S represents the quantity of columns included in the block matrix, $2\cdot S=L$, and $\Delta$ is a positive integer, where the integer set $A'''$ is generated based on the integer set $A'$, or the integer set $A'''$ is generated based on the integer set $A''$, and the integer set $A''$ is generated based on the integer set $A'$.

Optionally, when R % 2=0 and [k/B]=0, f(R % 2, [k/B])=51, when R % 2=0 and [k/B]=1, f(R % 2, [k/B])=47, when R % 2=0 and [k/B]=2, f(R % 2, [k/B])=27, when R % 2=0 and [k/B]=3, f(R % 2, [k/B])=13, when R % 2=1 and [k/B]=0, f(R % 2, [k/B])=41, when R % 2=1 and [k/B]=1, f(R % 2, [k/B])=39, when R % 2=1 and [k/B]=2, f(R % 2, [k/B])=33, or when R % 2=1 and [k/B=3, f(R % 2, [k/B])=23.

Optionally, when R % 2=0 and [k/B]=0, f(R % 2, [k/B])=31, when R % 2=0 and [k/B]=1, f(R % 2, [k/B])=29, when R % 20 and [k/B]=2, f(R % 2, [k/B])=25, when R % 2=0 and [k/B]=3, f(R % 2, [k/B])=13, when R % 2=1 and [k/B]=0, f(R % 2, [k/B])=45, when R % 2=1 and [k/B]=1, f(R % 2, [k/B])=35, when R % 2=1 and [k/B]=2, f(R % 2, [k/B])=21, or when R % 2=1 and [k/B]=3, f(R % 2, [k/B])=13.

Optionally, when R % 2=0 and [k/B]=0, f(R % 2, [k/B])=25, when R % 2=0 and [k/B]=1, f(R % 2, [k/B])=23, when R % 2=0 and [k/B]=2, f(R % 2, [k/B])=17, when R % 2=0 and [k/B]=3, f(R % 2, [k/B])=13, when R % 2=1 and [k/B]=0, f(R % 2, [k/B])=25, when R % 2=1 and [k/B]=1, f(R % 2, [k/B])=23, when R % 2=1 and [k/B]=2, f(R % 2, [k/B])=17, or when R % 2=1 and [k/B]=3, f(R % 2, [k/B])=13.

According to a fifth aspect, a communication apparatus is provided, including the modules or units configured to perform the method in the first aspect or any possible implementation of the first aspect.

According to a sixth aspect, a wireless communication apparatus is provided, including the modules or units configured to perform the method in the second aspect or any possible implementation of the second aspect.

According to a seventh aspect, a communication device is provided, including a processor, where the processor is coupled to a memory, and may be configured to perform the method in the first aspect or any possible implementation of the first aspect. Optionally, the communication device further includes the memory. Optionally, the communication device further includes a communication interface. The processor is coupled to the communication interface. Optionally, the communication device further includes a communication interface. The processor is coupled to the communication interface.

In an implementation, the communication device is a network device. When the communication device is a network device, the communication interface may be a transceiver or an input/output interface.

In another implementation, the communication device is a chip or a chip system. When the communication device is a chip or a chip system, the communication interface may be an input/output interface, an interface circuit, an output circuit, an input circuit, a pin, a related circuit, or the like on the chip or the chip system. The processor may alternatively be embodied as a processing circuit or a logic circuit.

According to an eighth aspect, a communication device is provided, including a processor. The processor is coupled to a memory, and may be configured to execute instructions in the memory, to implement the method according to the second aspect or any possible implementation of the second aspect. Optionally, the communication device further includes the memory. Optionally, the communication device further includes a communication interface. The processor is coupled to the communication interface. Optionally, the transceiver may be a transceiver circuit. Optionally, the input/output interface may be an input/output circuit.

In an implementation, the communication device is a terminal device. When the communication device is a terminal device, the communication interface may be a transceiver or an input/output interface. Optionally, the transceiver may be a transceiver circuit. Optionally, the input/output interface may be an input/output circuit.

In another implementation, the communication device is a chip or a chip system. When the communication device is a chip or a chip system, the communication interface may be an input/output interface, an interface circuit, an output circuit, an input circuit, a pin, a related circuit, or the like on the chip or the chip system. The processor may alternatively be embodied as a processing circuit or a logic circuit.

According to a ninth aspect, a processor is provided, including an input circuit, an output circuit, and a processing circuit. The processing circuit is configured to receive a signal through the input circuit, and transmit a signal through the output circuit, to implement the method according to any one of the first aspect to the fourth aspect and any one of the possible implementations of the first aspect to the fourth aspect.

In a specific implementation process, the processor may be a chip, the input circuit may be an input pin, the output circuit may be an output pin, and the processing circuit may be a transistor, a gate circuit, a trigger, various logic circuits, or the like. An input signal received by the input circuit may be received and input by, for example, but not limited to, a receiver, a signal output by the output circuit may be output to, for example, but not limited to, a transmitter and transmitted by the transmitter, and the input circuit and the output circuit may be a same circuit, where the circuit is used as the input circuit and the output circuit at different moments. Specific implementations of the processor and the various circuits are not limited in this embodiment of this disclosure.

According to a tenth aspect, a processing apparatus is provided, including a processor and a memory. The processor is configured to read instructions stored in the memory, receive a signal through a receiver, and transmit a signal through a transmitter, to perform the method according to any one of the first aspect to the fourth aspect and the possible implementations of the first aspect to the fourth aspect.

Optionally, there are one or more processors and one or more memories.

Optionally, the memory may be integrated with the processor, or the memory and the processor are separately disposed.

In a specific implementation process, the memory may be a non-transitory memory, for example, a read-only memory (ROM). The memory and the processor may be integrated into one chip, or may be disposed in different chips. A type of the memory and a manner in which the memory and the processor are disposed are not limited in this embodiment of this disclosure.

It should be understood that a related-data exchange process, for example, sending indication information, may be a process of outputting the indication information from the processor, and receiving capability information may be a process of receiving the input capability information by the processor. Further, data output by the processor may be output to a transmitter, and input data received by the processor may be from a receiver. The transmitter and the receiver may be collectively referred to as a transceiver.

The processor according to the tenth aspect may be a chip. The processor may be implemented by using hardware or software. When the processor is implemented by using hardware, the processor may be a logic circuit, an integrated circuit, or the like, or when the processor is implemented by using software, the processor may be a general-purpose processor, and is implemented by reading software code stored in the memory. The memory may be integrated into the processor, or may exist independently outside the processor.

According to an eleventh aspect, a computer program product is provided. The computer program product includes a computer program (or code or instructions). When the computer program is run, a computer is enabled to perform the method according to any one of the first aspect to the fourth aspect and the possible implementations of the first aspect to the fourth aspect.

According to a twelfth aspect, a computer-readable medium is provided. The computer-readable medium stores a computer program (or code or instructions). When the computer program is run on a computer, the computer is enabled to perform the method according to any one of the first aspect to the fourth aspect and the possible implementations of the first aspect to the fourth aspect.

DESCRIPTION OF EMBODIMENTS

Technical solutions in embodiments of this disclosure may be applied to various communication systems, for example, a Long-Term Evolution (LTE) system, an LTE frequency-division duplex (FDD) system, an LTE time-division duplex (TDD) system, a Universal Mobile Telecommunications System (UMTS), a Worldwide Interoperability for Microwave Access (WIMAX) communication system, a 5th generation (5G) mobile communication system, or a New Radio (NR) access technology system. The 5G mobile communication system may include a non-standalone (NSA) communication system and/or a standalone (SA) communication system.

The technical solutions provided in this disclosure may be further applied to a machine type communication (MTC) network, a LTE-machine type communication technology (LTE-M), a device-to-device (D2D) network, a machine-to-machine (M2M) network, an Internet of things (IoT) network, or another network. The IoT network may include, for example, an internet of vehicles. Communication modes in an internet of vehicles system are collectively referred to as vehicle-to-everything (vehicle to X (V2X), where X may represent anything). For example, the V2X may include vehicle-to-vehicle (V2V) communication, vehicle-to-infrastructure (V2I) communication, vehicle-to-pedestrian (V2P) communication, vehicle-to-network (V2N) communication, or the like.

The technical solutions provided in this disclosure may be further applied to a future communication system, for example, a sixth generation (6G) mobile communication system. This is not limited in this disclosure.

A coding scheme provided in embodiments of this disclosure may be applied to a coding technology such as forward error correction (FEC).

Figure 1:
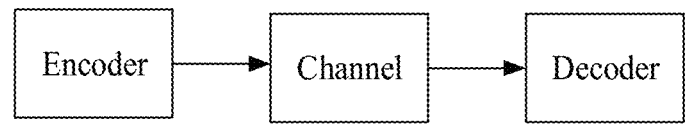
FIG. 1 is a schematic diagram of a structure of an example of a communication system according to this disclosure.

An FEC spatial coupling solution of the present disclosure is an FEC coding scheme, and is applied to an information transmission system and which is shown in FIG. 1. Information is encoded by an encoder, that is, through FEC encoding, is transmitted through a channel, and decoded by a decoder through FEC decoding on a receive end and restored to original information.

For example, in the communication system shown in FIG. 1, original information is encoded (for example, FEC encoding) by an encoder side (encoder), transmitted through a channel, received by a decoder side (decoder), and decoded (for example, FEC decoding) by the decoder side, to restore the original information.

The encoder side may also be referred to as a transmit end (or a sending device), and the decoder side may also be referred to as a receive end (or a receiving device) of information or data.

In embodiments of this disclosure, the transmit end and the receive end may perform wired communication, for example, optical communication, and the coding scheme in this disclosure may be applied to a coding process of wired communication.

Alternatively, in embodiments of this disclosure, the transmit end and the receive end may perform wireless communication, for example, may be applied to a coding process in a wireless communication system.

In other words, the solutions provided in this disclosure may be used in a coding process of the sending device.

The sending device may be a network device, and the receiving device may be a terminal device.

Alternatively, the sending device may be a terminal device, and the receiving device may be a network device.

Alternatively, the sending device may be a terminal device, and the receiving device may be a terminal device.

Alternatively, the sending device may be a network device, and the receiving device may be a network device.

In embodiments of this disclosure, the network device may be any device having receiving and sending functions (wired or wireless). The device is, but not limited to, an evolved NodeB (eNB), a radio network controller (RNC), a NodeB (NB), a base station controller (BSC), a base transceiver station (BTS), a home NodeB (for example, a home evolved NodeB (HNB)), a baseband unit (BBU), an access point (AP) in a WI-FI system, a wireless relay node, a wireless backhaul node, a transmission point (TP), a transmission and reception point (TRP), or the like. Alternatively, the device may be a next generation NB (gNB) or a transmission point (TRP or TP) in a 5G system such as an NR system, may be one antenna panel or a group (including a plurality of antenna panels) of antenna panels of a base station in a 5G system, or may be a network node, such as a baseband unit (BBU) or a distributed unit (DU), that constitute a gNB or a transmission point, a network device in an optical network, or an optical transmission physical layer device.

In some deployment, the gNB may include a centralized unit (CU) and the DU. The gNB may further include an active antenna unit (AAU). The CU implements a part of functions of the gNB, and the DU implements a part of functions of the gNB. For example, the CU is responsible for processing a non-real-time protocol and service, and implements functions of a Radio Resource Control (RRC) layer and a Packet Data Convergence Protocol (PDCP) layer. The DU is responsible for processing a physical layer protocol and a real-time service, and implements functions of a radio link control (RLC) layer, a medium access control (MAC) layer, and a physical layer (PHY). The AAU implements a part of processing functions of the physical layer, radio frequency processing, and a function related to an active antenna. Information at the RRC layer is eventually converted into information at the PHY layer, or is converted from information at the PHY layer. Therefore, in this architecture, higher layer signaling such as RRC layer signaling may also be considered as being sent by the DU or sent by the DU and the AAU. It may be understood that the network device may be a device including one or more of the following nodes: a CU node, a DU node, or an AAU node. In addition, the CU may be a network device in a radio access network (RAN), or the CU may be a network device in a core network (CN). This is not limited in this disclosure.

The network device serves a cell, and the terminal device communicates with the cell by using a transmission resource (for example, a frequency domain resource or a spectrum resource) allocated by the network device. The cell may belong to a macro base station (for example, a macro eNB or a macro gNB), or may belong to a base station corresponding to a small cell. The small cell herein may include a metro cell, a micro cell, a pico cell, a femto cell, and the like. These small cells have characteristics of small coverage and low transmit power, and are applicable to providing a high-rate data transmission service.

In embodiments of this disclosure, the terminal device may also be referred to as user equipment (UE), an access terminal, a subscriber unit, a subscriber station, a mobile station, a mobile, a remote station, a remote terminal, a mobile device, a user terminal, a terminal, a wireless communication device, a user agent, or a user apparatus.

The terminal device may be a device that provides voice/data connectivity for a user, for example, a handheld device or a vehicle-mounted device that has a wireless connection function. Some examples of the terminal may be a mobile phone, a tablet computer (or IPAD), a computer with a wireless sending/receiving function (for example, a notebook computer or a palmtop computer), a mobile internet device (MID), a virtual reality (VR) device, an augmented reality (AR) device, a wireless terminal in industrial control, a wireless terminal in self driving, a wireless terminal in remote medical, a wireless terminal in smart grid, a wireless terminal in transportation safety, a wireless terminal in smart city, a wireless terminal in smart home, a cellular phone, a cordless phone, a Session Initiation Protocol (SIP) phone, a wireless local loop (WLL) station, a personal digital assistant (PDA), a handheld device or computing device with a wireless communication function, another processing device connected to a wireless modem, a vehicle-mounted device, a wearable device, a terminal device in a 5G network, a terminal device in a future evolved public land mobile network (PLMN), or the like.

The wearable device may also be referred to as a wearable intelligent device, and is a general term of wearable devices such as glasses, gloves, watches, clothes, and shoes that are developed by applying wearable technologies in intelligent designs of daily wear. The wearable device is a portable device that is directly worn on a body or integrated into clothes or an accessory of a user. The wearable device is not merely a hardware device, but is used to implement a powerful function through software support, data exchange, and cloud interaction. Generalized wearable intelligent devices include full-featured and large-sized devices that can implement all or a part of functions without depending on smartphones, for example, smart watches or smart glasses, and devices that focus on only one type of application function and need to work with another device such as a smartphone, for example, various smart bands or smart accessories for monitoring physical signs.

In addition, the terminal device may alternatively be a terminal device in an IoT system. The IoT is an important part of future information technology development. A main technical feature of the IoT is to connect things to a network by using a communication technology, to implement an intelligent network for human-machine interconnection and thing-thing interconnection. The IoT technology can implement massive connections, intensive coverage, and power saving for terminals by using, for example, a narrow band NB technology.

The terminal device may alternatively include sensors such as an intelligent printer, a train detector, or a gas station, and main functions of the terminal device include collecting data (which is a function of a part of terminal devices), receiving control information and downlink data of a network device, sending an electromagnetic wave, and transmitting uplink data to the network device.

Figure 2:
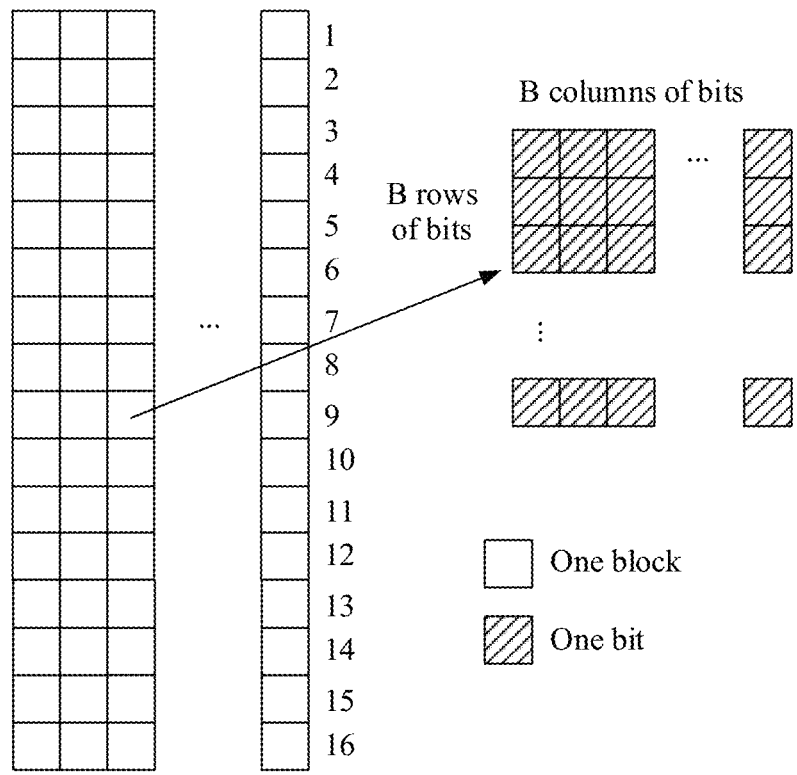
FIG. 2 is a schematic diagram of an example of a symbol matrix and a block matrix according to this disclosure.

As shown in FIG. 2, a codeword generated based on a spatially coupled coding scheme in this disclosure is a semi-infinite symbol sequence. The symbol sequence constitutes one symbol matrix. A quantity of rows in the symbol matrix is semi-infinite. The symbol matrix includes N columns, where N is a positive integer. Semi-infinite may be understood as that the quantity of rows in the symbol matrix is not limited.

In embodiments of this disclosure, a symbol may be understood as a carrier of information or data. For example, in binary symbols, one symbol is one bit. For another example, in hexadecimal symbols, one symbol is one character.

For ease of understanding and description, the following describes in detail a coding scheme in an embodiment of this disclosure by using an example in which a bit is used as a symbol.

For ease of understanding and description, the following describes in detail the coding scheme provided in this disclosure by using an example in which N=128.

A bit matrix (that is, an example of a symbol matrix) is divided into a plurality of blocks (or a symbol block or a bit block), where each block includes B×B bits.

In this embodiment of this disclosure, B may be an integer greater than or equal to 1.

It should be noted that, when a value of B is 1, each symbol is one block.

By way of example rather than limitation, in this embodiment of this disclosure, B may be exactly divided by N.

Alternatively, B may not be exactly divided by N. This is not particularly limited in this disclosure.

For ease of understanding and description, the following describes in detail the coding scheme in this disclosure by using an example in which B=32.

In this case, each row of a block matrix including the plurality of blocks includes S=NB blocks.

It should be noted that the bit matrix and the block matrix are different names based on division manners of a same matrix in different dimensions, and are actually a same semi-infinite bit matrix.

That is, when N=128 and B=32, S=4.

The codeword generated based on the spatially coupled coding scheme in this disclosure has the following characteristics.

The codeword includes a plurality of component codes.
Each component code corresponds to 2S blocks.
The 2S blocks include S first blocks and S second blocks.
That is, each component code includes two parts, each component code may be considered as a symbol vector x, and a length of each component code is 2N.

In other words, each component code includes 2N bits.
One half of the bits of the component code (referred to as a first part of the component code below for ease of understanding and description) includes one column of bits (for example, 4×32=128 bits) in each of the S first blocks, and the other half of the bits of the component code (referred to as a second part of the component code below for ease of understanding and description) corresponds to bits (for example, 4×32=128 bits) in the S second blocks, where the S second blocks are S blocks in a specific row of the block matrix.

The S first blocks of the first part are in different rows of the block matrix, and the S second blocks of the second part are in a same row of the block matrix.

The S second blocks of the second part may be understood as blocks to be filled with encoded bits.

The S first blocks of the first part may be understood as blocks filled with encoded bits. Subsequently, a method and a process for selecting the S first blocks of the first part (first partial blocks for short below for ease of understanding and differentiation) in this disclosure are described in detail.

It is assumed that currently input to-be-encoded information or data corresponds to Q bits. In the following, for ease of understanding and description, a bit corresponding to the currently input to-be-encoded information or data is referred to as a second bit or a current bit.

In addition, N bits (referred to as first bits below for ease of understanding and description) are selected from the S first partial blocks. The first bits may include bits in a $y^{th}$ column in each of the S first partial blocks. In addition, a value of y may be specified in a protocol, or a value of y may be determined through negotiation between an encoder side and a decoder side. This is not particularly limited in this disclosure.

A bit sequence including the second bit and the first bit is used as an information part of the component code. It is assumed that the information part includes k bits. In this case, Q=k−N, where 2N>k>N.

For ease of understanding and description, the following describes in detail the coding scheme in this disclosure by using an example in which k=239.

In this case, the information part may be checked to generate (2N−k) checked bits (which may also be referred to as overheads). For example, the check may satisfy a check constraint: xH=0, where H is a (2N, 2N−k) check matrix. For example, H is a check matrix of an extended BCH code (256, 239). A minimal Hamming distance for this BCH code is 6. In other words, in this disclosure, the codeword based on spatial coupling may be encoded by using one BCH codebook. The BCH code is the abbreviation for Bose, Ray-Chaudhuri, and Hocquenghem, and is used in a coding method that is widely studied in coding theory, especially in error-correction coding. The term BCH code is a multilevel, cyclic, error correction, variable length digital code for correcting a plurality of random error patterns. The BCH code may also be used for multi-level phase-shift keying based on a prime or a power of a prime.

That is, when N=128 and k=239, overheads of blocks of the second part of the component code (second partial blocks for short below for ease of understanding and differentiation) are 2N−k=17 bits.

A ratio of the overheads of the component code is 17/128, a bit rate of the codeword is 111/128=0.867, and OH=17/(128−17)=15.3%.

In this case, bits in the encoded component code except the bits in the first partial blocks, that is, the Q second bits and the (2N−k) checked bits (a total of N bits) constitute a $z^{th}$ row in each block in the S second partial blocks. In addition, a value of z may be specified in a protocol, or a value of z may be determined through negotiation between the encoder side and the decoder side. This is not particularly limited in this disclosure. For example, values of y and z may be the same.

In this embodiment of this disclosure, each bit in the codeword generated in the foregoing manner belongs to a corresponding component code. Each component code is a bit vector x whose length is 2N, where N bits are from the first partial blocks or encoded bits, and (k−N) bits in the other N bits are bits of new (or to-be-encoded) information or data.

The following describes in detail a method and a process for selecting the first partial blocks in this embodiment of this disclosure.

For ease of understanding which bits in the foregoing bit matrix are a part of a component code (in particular, the component code corresponding to the first partial blocks), the bit matrix uses the following structure.

As described above, the bit matrix is divided into a plurality of blocks. Each block includes B×B bits, for example, B=32, and the plurality of blocks are arranged in the rows and columns of the block matrix. That is, each row of the block matrix including the plurality of blocks includes S=N/B blocks. For example, when N=128, N/B=4. Each block is identified by using a row number R and a column number C, where C=0, 1, ..., N/B−1, R is an integer, and an arrangement order of the blocks in the matrix (or a sequence number arrangement order) is from left to right and from top to bottom.

Each bit in each block is indicated by a row number r and a column number c, where r=0, 1, ..., B−1, and c=0, 1, ..., B−1. Bits (0, 0) are at the top-left corner of the block.

In conclusion, each bit in the bit matrix may be represented by using a quaternary vector, that is, {R, C, r, c}.

In addition, bits in each row of the bit matrix may be identified by (R, r), where R is a row number of a block corresponding to the row, and r is a row number of the row in the block.

In this disclosure, an $R^{th}$ row of block matrix needs to be filled with the current to-be-encoded bits. In this case, the S first partial blocks are respectively from S rows of the block matrix, and the S first partial blocks are grouped into at least one block group. A difference between row numbers of any two blocks in any block group is not the same as a difference between row numbers of other two blocks in the any block group. For example, it is assumed that a first block group includes a block S1, a block S2, a block S3, and a block S4, a difference between a row number (denoted as G1) of the S1 and a row number (denoted as G2) of the S2 is denoted as E1, and a difference between a row number (denoted as G3) of the S3 and a row number (denoted as G4) of the S4 is denoted as E2. In this case, E1 is not equal to E2.

That is, in this embodiment of this disclosure, the first partial blocks may be grouped into at least one block group, and a difference between row numbers of any two first partial blocks in any block group is not the same as a difference between row numbers of other two first partial blocks in the any block group.

By way of example rather than limitation, this disclosure lists the following solutions, so that the first partial blocks satisfy the foregoing condition. The difference between the row numbers of the any two first partial blocks in the any block group is not the same as the difference between the row numbers of the other two first partial blocks in the any block group.

In this embodiment of this disclosure, a component code of the codeword based on spatial coupling may be identified by using a row number of a block. As described above, the component code includes first partial blocks and second partial blocks, and a bit t (t=0, 1, ..., 2N−1) of a component code (R, r) may be expressed by using the following quaternary symbol:

If $t<N, t=\{R-f(R\% 2,[k/B]),[k/B],h\% B,r\}$, and  formula (1)

If $t \geq N, t=\{R,[(k-N)/B],r,h\% B\}$.  formula (2)

[ ] represents a rounding down operation, and a % b represents a modulus value of a and b.

h represents a row location of the bit t in a bit matrix including the bit t, or h represents a column number (or a sequence number) of the bit t in a bit matrix including the bit t.

In addition, a function f(i, j) may be designed in the following manner.

f(i, j) represents a positive integer function, a value of i is in a domain {0, 1}, and a value of j is in a domain {0, 1, ..., S−1}, where S is a nonnegative integer.

In this embodiment of this disclosure, the function f(i, j) may be the following function:

$$f(i, j) = \begin{cases} (a_{L-j} - b - 1) \cdot 2 + 1, i = 0 \\ (b - a_{j+1}) \cdot 2 + 1, i = 1 \end{cases}$$

$$L = 2 \times S.$$

In this embodiment of the present disclosure, a data set may be defined.

In this disclosure, a rule A may be constructed (or set), to select, from the data set, a value of a that satisfies the following condition. The rule A may also be referred to as an integer set A, that is, the integer set A is a set of values of a.

$0 = a_1 < a_2 < a_3 < \ldots < a_L.$ b is an integer, and $a_S \leq b < a_{S+1}$.

By way of example rather than limitation, the foregoing rule A (or the integer set A) has the following characteristics, and there is no same difference between any two pairs of integers. In this embodiment of this disclosure, the rule A may be represented by using the following formula:

$\forall 1 \leq i_1 < j_1 \leq L, 1 \leq i_2 < j_2 \leq L$, and $a_{j_1} - a_{i_1} = a_{j_2} - a_{i_2} \Leftrightarrow j_1 = j_2, i_1 = i_2.$ L is a quantity of integers included in the integer set A.

By way of example rather than limitation, in this embodiment of this disclosure, the rule A may be constructed in any one of the following manners.

Manner 1: By way of example rather than limitation, the following Table 1 shows a correspondence between a value of L and an integer set (namely, the integer set A) that satisfies the rule A.

TABLE 1

| L | Integer set A |
|---|---|
| 2 | 0, 1 |
| 3 | 0, 1, 3 |
| 4 | 0, 1, 4, 6 |
| 5 | 0, 1, 4, 9, 11 |
|   | 0, 2, 7, 8, 11 |
| 6 | 0, 1, 4, 10, 12, 17 |
|   | 0, 1, 4, 10, 15, 17 |
|   | 0, 1, 8, 11, 13, 17 |
|   | 0, 1, 8, 12, 14, 17 |

TABLE 1-continued

| L | Integer set A |
|---|---|
| 7 | 0, 1, 4, 10, 18, 23, 25 |
|  | 0, 1, 7, 11, 20, 23, 25 |
|  | 0, 1, 11, 16, 19, 23, 25 |
|  | 0, 2, 3, 10, 16, 21, 25 |
|  | 0, 2, 7, 13, 21, 22, 25 |
| 8 | 0, 1, 4, 9, 15, 22, 32, 34 |
| 9 | 0, 1, 5, 12, 25, 27, 35, 41, 44 |
| 10 | 0, 1, 6, 10, 23, 26, 34, 41, 53, 55 |
| 11 | 0, 1, 4, 13, 28, 33, 47, 54, 64, 70, 72 |
|  | 0, 1, 9, 19, 24, 31, 52, 56, 58, 69, 72 |
| 12 | 0, 2, 6, 24, 29, 40, 43, 55, 68, 75, 76, 85 |
| 13 | 0, 2, 5, 25, 37, 43, 59, 70, 85, 89, 98, 99, 106 |
| 14 | 0, 4, 6, 20, 35, 52, 59, 77, 78, 86, 89, 99, 122, 127 |
| 15 | 0, 4, 20, 30, 57, 59, 62, 76, 100, 111, 123, 136, 144, 145, 151 |
| 16 | 0, 1, 4, 11, 26, 32, 56, 68, 76, 115, 117, 134, 150, 163, 168, 177 |
| 17 | 0, 5, 7, 17, 52, 56, 67, 80, 81, 100, 122, 138, 159, 165, 168, 191, 199 |
| 18 | 0, 2, 10, 22, 53, 56, 82, 83, 89, 98, 130, 148, 153, 167, 188, 192, 205, 216 |
| 19 | 0, 1, 6, 25, 32, 72, 100, 108, 120, 130, 153, 169, 187, 190, 204, 231, 233, 242, 246 |
| 20 | 0, 1, 8, 11, 68, 77, 94, 116, 121, 156, 158, 179, 194, 208, 212, 228, 240, 253, 259, 283 |
| 21 | 0, 2, 24, 56, 77, 82, 83, 95, 129, 144, 179, 186, 195, 255, 265, 285, 293, 296, 310, 329, 333 |
| 22 | 0, 1, 9, 14, 43, 70, 106, 122, 124, 128, 159, 179, 204, 223, 253, 263, 270, 291, 330, 341, 353, 356 |
| 23 | 0, 3, 7, 17, 61, 66, 91, 99, 114, 159, 171, 199, 200, 226, 235, 246, 277, 316, 329, 348, 350, 366, 372 |
| 24 | 0, 9, 33, 37, 38, 97, 122, 129, 140, 142, 152, 191, 205, 208, 252, 278, 286, 326, 332, 353, 368, 384, 403, 425 |
| 25 | 0, 12, 29, 39, 72, 91, 146, 157, 160, 161, 166, 191, 207, 214, 258, 290, 316, 354, 372, 394, 396, 431, 459, 467, 480 |
| 26 | 0, 1, 33, 83, 104, 110, 124, 163, 185, 200, 203, 249, 251, 258, 314, 318, 343, 356, 386, 430, 440, 456, 464, 475, 487, 492 |
| 27 | 0, 3, 15, 41, 66, 95, 97, 106, 142, 152, 220, 221, 225, 242, 295, 330, 338, 354, 382, 388, 402, 415, 486, 504, 523, 546, 553 |
| 28 | 0, 3, 15, 41, 66, 95, 97, 106, 142, 152, 220, 221, 225, 242, 295, 330, 338, 354, 382, 388, 402, 415, 486, 504, 523, 546, 553, 585 |

Manner 2:

The integer set $A=\{a_L-a_i|1\leq i\leq L\}$, where the integer set $\{a_1, a_2, \ldots, a_L\}$ may be determined based on the foregoing manner 1, that is, the integer set $\{a_1, a_2, \ldots, a_L\}$ is generated based on an integer set $B=\{a_1, a_2, \ldots, a_W\}$. For example, the integer set A is a set of integers obtained by performing operation processing on integers in the integer set B according to an operation rule corresponding to the integer set A, and a correspondence between a quantity of integers included in the integer set B and specific integers included in the integer set B may be shown in the following Table 2.

TABLE 2

| W | Integer set B |
|---|---|
| 2 | 0, 1 |
| 3 | 0, 1, 3 |
| 4 | 0, 1, 4, 6 |
| 5 | 0, 1, 4, 9, 11 |
|  | 0, 2, 7, 8, 11 |
| 6 | 0, 1, 4, 10, 12, 17 |
|  | 0, 1, 4, 10, 15, 17 |
|  | 0, 1, 8, 11, 13, 17 |
|  | 0, 1, 8, 12, 14, 17 |
| 7 | 0, 1, 4, 10, 18, 23, 25 |
|  | 0, 1, 7, 11, 20, 23, 25 |
|  | 0, 1, 11, 16, 19, 23, 25 |
|  | 0, 2, 3, 10, 16, 21, 25 |
|  | 0, 2, 7, 13, 21, 22, 25 |
| 8 | 0, 1, 4, 9, 15, 22, 32, 34 |
| 9 | 0, 1, 5, 12, 25, 27, 35, 41, 44 |
| 10 | 0, 1, 6, 10, 23, 26, 34, 41, 53, 55 |
| 11 | 0, 1, 4, 13, 28, 33, 47, 54, 64, 70, 72 |
|  | 0, 1, 9, 19, 24, 31, 52, 56, 58, 69, 72 |
| 12 | 0, 2, 6, 24, 29, 40, 43, 55, 68, 75, 76, 85 |
| 13 | 0, 2, 5, 25, 37, 43, 59, 70, 85, 89, 98, 99, 106 |
| 14 | 0, 4, 6, 20, 35, 52, 59, 77, 78, 86, 89, 99, 122, 127 |
| 15 | 0, 4, 20, 30, 57, 59, 62, 76, 100, 111, 123, 136, 144, 145, 151 |
| 16 | 0, 1, 4, 11, 26, 32, 56, 68, 76, 115, 117, 134, 150, 163, 168, 177 |
| 17 | 0, 5, 7, 17, 52, 56, 67, 80, 81, 100, 122, 138, 159, 165, 168, 191, 199 |

TABLE 2-continued

| W | Integer set B |
|---|---|
| 18 | 0, 2, 10, 22, 53, 56, 82, 83, 89, 98, 130, 148, 153, 167, 188, 192, 205, 216 |
| 19 | 0, 1, 6, 25, 32, 72, 100, 108, 120, 130, 153, 169, 187, 190, 204, 231, 233, 242, 246 |
| 20 | 0, 1, 8, 11, 68, 77, 94, 116, 121, 156, 158, 179, 194, 208, 212, 228, 240, 253, 259, 283 |
| 21 | 0, 2, 24, 56, 77, 82, 83, 95, 129, 144, 179, 186, 195, 255, 265, 285, 293, 296, 310, 329, 333 |
| 22 | 0, 1, 9, 14, 43, 70, 106, 122, 124, 128, 159, 179, 204, 223, 253, 263, 270, 291, 330, 341, 353, 356 |
| 23 | 0, 3, 7, 17, 61, 66, 91, 99, 114, 159, 171, 199, 200, 226, 235, 246, 277, 316, 329, 348, 350, 366, 372 |
| 24 | 0, 9, 33, 37, 38, 97, 122, 129, 140, 142, 152, 191, 205, 208, 252, 278, 286, 326, 332, 353, 368, 384, 403, 425 |
| 25 | 0, 12, 29, 39, 72, 91, 146, 157, 160, 161, 166, 191, 207, 214, 258, 290, 316, 354, 372, 394, 396, 431, 459, 467, 480 |
| 26 | 0, 1, 33, 83, 104, 110, 124, 163, 185, 200, 203, 249, 251, 258, 314, 318, 343, 356, 386, 430, 440, 456, 464, 475, 487, 492 |
| 27 | 0, 3, 15, 41, 66, 95, 97, 106, 142, 152, 220, 221, 225, 242, 295, 330, 338, 354, 382, 388, 402, 415, 486, 504, 523, 546, 553 |
| 28 | 0, 3, 15, 41, 66, 95, 97, 106, 142, 152, 220, 221, 225, 242, 295, 330, 338, 354, 382, 388, 402, 415, 486, 504, 523, 546, 553, 585 |

Manner 3:

The integer set $A=\{a_1, a_2, \ldots, a_S, \Delta+a_{S+1}, \Delta+a_{S+2}, \ldots, \Delta+a_{2 \cdot S}\}$, where $\Delta$ is a positive integer.

An integer set $\{a_1, a, \ldots, a_{2 \cdot S}\}$ may be determined based on the foregoing manner 1. That is, the integer set $\{a_1, a, \ldots, a_{2 \cdot S}\}$ is generated based on the foregoing integer set B.

Alternatively, an integer set $\{a_1, a, \ldots, a_{2 \cdot S}\}$ may be determined based on the foregoing manner 2. That is, the integer set $\{a_1, a, \ldots, a_{2 \cdot S}\}$ is generated based on an integer set $C=\{a_Z-a_i | 1 \le i \le Z\}$, where $Z \ge 2S$, an integer set $\{a_1, a_2, \ldots, a_Z\}$ is generated based on the integer set B, and $W \ge Z$.

Manner 4:

An integer set $A=\{a_1^{(1)}, a_2^{(1)}, \ldots a_{L1}^{(1)}, \delta+a_1^{(2)}, \delta+a_2^{(2)}, \ldots, \delta+a_{L2}^{(2)}\}$, where $\delta$ is a positive integer, and $\delta > a_{L1}^{(1)}$.

In addition, an integer set $A_1=\{a_1^{(1)}, a_2^{(1)}, \ldots, a_{L1}^{(1)}\}$ and an integer set $A_2=\{a_1^{(2)}, a_2^{(2)}, \ldots, a_{L2}^{(2)}\}$ may be determined based on the foregoing manner 1.

Alternatively, an integer set $A_1=\{a_1^{(1)}, a_2^{(1)}, \ldots, a_{L1}^{(1)}\}$ and an integer set $A_2=\{a_1^{(2)}, a_2^{(2)}, \ldots, a_{L2}^{(2)}\}$ may be determined based on the foregoing manner 2.

Alternatively, an integer set $A_1=\{a_1^{(1)}, a_2^{(1)}, \ldots, a_{L1}^{(1)}\}$ and an integer set $A_2=\{a_1^{(2)}, a_2^{(2)}, \ldots, a_{L2}^{(2)}\}$ may be determined based on the foregoing manner 3.

Alternatively, an integer set $A_1=\{a_1^{(1)}, a_2^{(1)}, \ldots, a_{L1}^{(1)}\}$ may be determined based on the foregoing manner 1, and an integer set $A_2=\{a_1^{(2)}, a_2^{(2)}, \ldots, a_{L2}^{(2)}\}$ may be determined based on the foregoing manner 2.

Alternatively, an integer set $A_1=\{a_1^{(1)}, a_2^{(1)}, \ldots, a_{L1}^{(1)}\}$ may be determined based on the foregoing manner 1, and an integer set $A_2=\{a_1^{(2)}, a_2^{(2)}, \ldots, a_{L2}^{(2)}\}$ may be determined based on the foregoing manner 3.

Alternatively, an integer set $A_1=\{a_1^{(1)}, a_2^{(1)}, \ldots, a_{L1}^{(1)}\}$ may be determined based on the foregoing manner 2, and an integer set $A_2=\{a_1^{(2)}, a_2^{(2)}, \ldots, a_{L2}^{(2)}\}$ may be determined based on the foregoing manner 1.

Alternatively, an integer set $A_1=\{a_1^{(1)}, a_2^{(1)}, \ldots, a_{L1}^{(1)}\}$ may be determined based on the foregoing manner 2, and an integer set $A_2=\{a_1^{(2)}, a_2^{(2)}, \ldots, a_{L2}^{(2)}\}$ may be determined based on the foregoing manner 3.

Alternatively, an integer set $A_1=\{a_1^{(1)}, a_2^{(1)}, \ldots, a_{L1}^{(1)}\}$ may be determined based on the foregoing manner 3, and an integer set $A_2=\{a_1^{(2)}, a_2^{(2)}, \ldots, a_{L2}^{(2)}\}$ may be determined based on the foregoing manner 1.

Alternatively, an integer set $A_1=\{a_1^{(1)}, a_2^{(1)}, \ldots, a_{L1}^{(1)}\}$ may be determined based on the foregoing manner 3, and an integer set $A_2=\{a_1^{(2)}, a_2^{(2)}, \ldots, a_{L2}^{(2)}\}$ may be determined based on the foregoing manner 2.

For example, the following Table 3 shows an example of values of f(i, j) in this disclosure.

TABLE 3

| f(i, j) | | j = 0 | j = 1 | j = 2 | j = 3 |
|---|---|---|---|---|---|
| i | i = 0 | 51 | 47 | 27 | 13 |
| | i = 1 | 41 | 39 | 33 | 23 |

Figure 3:
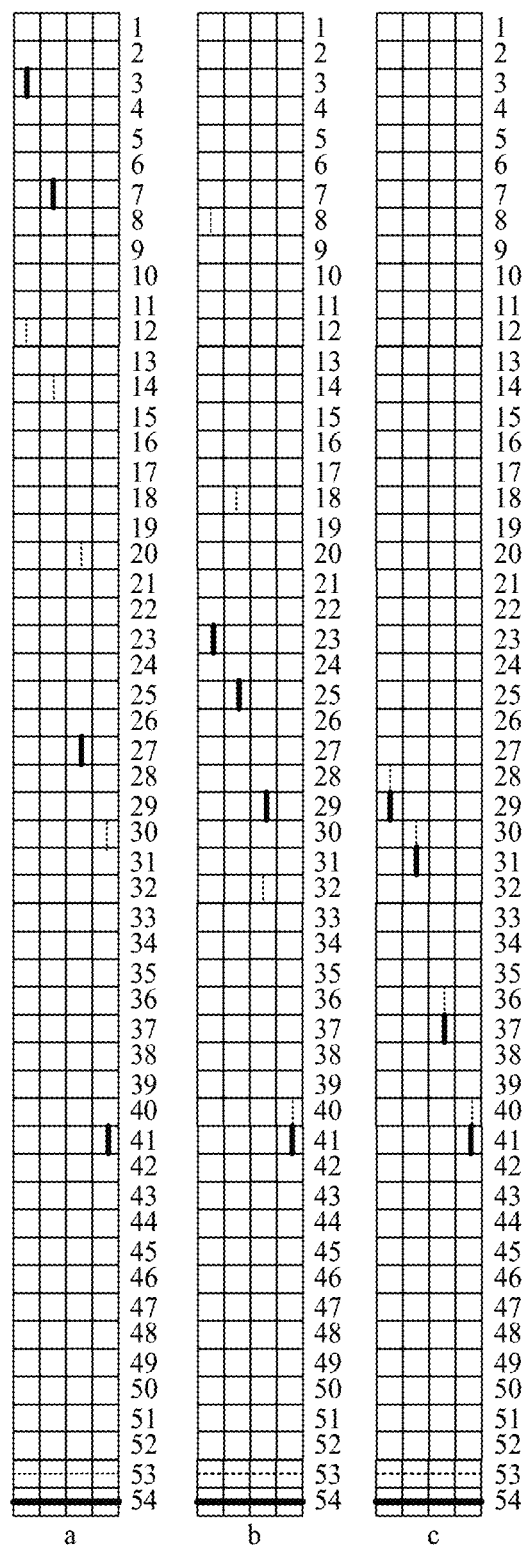
FIG. 3 is a schematic diagram of a manner of determining first partial blocks according to this disclosure.

As shown by a in FIG. 3, in an implementation (denoted as manner a) corresponding to the values of f(i, j) shown in Table 3, four blocks in a $54^{th}$ row of a block matrix marked by a thick solid line represent currently input information bits and checked bits. Because 54 is an even number, a value of i is 0. In this case, first partial blocks corresponding to second partial blocks in the $54^{th}$ row are determined by using values corresponding to i=0 in Table 2, that is, the first partial blocks are the $1^{st}$ block in a $(54-51=3)^{rd}$ row, the $2^{nd}$ block in a $(54-47=7)^{th}$ row, the $3^{rd}$ block in a $(54-27=27)^{th}$ row, and the $4^{th}$ block in a $(54-13=41)^{st}$ row.

Similarly, four blocks in a $53^{rd}$ row of the block matrix marked by a dashed line represent currently input information bits and checked bits. Because 53 is an odd number, the value of i is 1. In this case, first partial blocks corresponding to second partial blocks in the $53^{rd}$ row are determined by using values corresponding to i=1 in Table 2, that is, the first partial blocks are the $1^{st}$ block in a $(53-41=12)^{nd}$ row, the $2^{nd}$ block in a $(53-39=14)^{th}$ row, the $3^{rd}$ block in a $(53-33=20)^{th}$ row, and the $4^{th}$ block in a $(53-23=30)^{th}$.

For another example, the following Table 4 shows another example of values of f(i, j) in this disclosure.

TABLE 4

| f(i, j) | | j = 0 | j = 1 | j = 2 | j = 3 |
|---|---|---|---|---|---|
| i | i = 0 | 31 | 29 | 25 | 13 |
| | i = 1 | 45 | 35 | 21 | 13 |

As shown by b in FIG. 3, in an implementation (denoted as manner b) corresponding to the values of f(i, j) shown in Table 4, four blocks in a $54^{th}$ row of the block matrix marked by a thick solid line represent currently input information bits and checked bits. Because 54 is an even number, a value of i is 0. In this case, first partial blocks corresponding to second partial blocks in the $54^{th}$ row are determined by using values corresponding to i=0 in Table 3, that is, the first partial blocks are the $1^{st}$ block in a $(54-31=23)^{rd}$ row, the $2^{nd}$ block in a $(54-29=25)^{th}$ row, the $3^{rd}$ block in a $(54-25=29)^{th}$ row, and the $4^{th}$ block in a $(54-13=41)^{st}$ row.

Similarly, four blocks in a $53^{rd}$ row of the block matrix marked by a dashed line represent currently input information bits and checked bits. Because 53 is an odd number, the value of i is 1. In this case, first partial blocks corresponding to second partial blocks in the $53^{rd}$ row are determined by using values corresponding to i=1 in Table 3, that is, the first partial blocks are the $1^{st}$ block in a $(53-45=8)^{th}$ row, the $2^{nd}$ block in a $(53-35=18)^{th}$ row, the $3^{rd}$ block in a $(53-21=32)^{nd}$ row, and the $4^{th}$ block in a $(53-13=40)^{th}$.

For still another example, the following Table 5 shows still another example of values of f(i, j) in this disclosure.

TABLE 5

| f(i, j) | | j = 0 | j = 1 | j = 2 | j = 3 |
|---|---|---|---|---|---|
| i | i = 0 | 25 | 23 | 17 | 13 |
| | i = 1 | 25 | 23 | 17 | 13 |

As shown by c in FIG. 3, in an implementation (denoted as manner c) corresponding to the values of f(i, j) shown in Table 5, four blocks in a $54^{th}$ row of a block matrix marked by a thick solid line represent currently input information bits and checked bits. Because 54 is an even number, a value of i is 0. In this case, first partial blocks corresponding to second partial blocks in the $54^{th}$ row are determined by using values corresponding to i=0 in Table 4, that is, the first partial blocks are the $1^{st}$ block in a $(54-25=29)^{th}$ row, the $2^{nd}$ block in a $(54-23=31)^{st}$ row, the $3^{rd}$ block in a $(54-17=37)^{th}$ row, and the $4^{th}$ block in a $(54-13=41)^{st}$ row.

Similarly, four blocks in a $53^{rd}$ row of the block matrix marked by a dashed line represent currently input information bits and checked bits. Because 53 is an odd number, the value of i is 1. In this case, first partial blocks corresponding to second partial blocks in the $53^{rd}$ row are determined by using values corresponding to i=1 in Table 4, that is, the first partial blocks are the $1^{st}$ block in a $(53-25=28)^{th}$ row, the $2^{nd}$ block in a $(53-23=30)^{th}$ row, the $3^{rd}$ block in a $(53-17=36)^{nd}$ row, and the $4^{th}$ block in a $(53-13=40)^{th}$.

The following describes an encoding process in this disclosure.

The encoding process in this embodiment of this disclosure is as follows. Encoding is performed serially in an order of row numbers. When a new component code (R, r) is to be encoded, all component codes (R', r') that satisfy R'<R should have been encoded.

A sequence x whose length is 2N is constructed, to encode the component code (R, r). N bits in the first half of the sequence x are read from a previously encoded symbol, for example, may be read from a bit matrix according to a rule shown in the foregoing formula (1). In the second half, first (k−N) (for example, 111) bits are bits of currently input information or data. Last (2N−k) (for example, 17) bits are checked bits, and xH=0 is satisfied. After being encoded, these bits in the second half are stored in corresponding locations in the bit matrix according to a rule in formula (2).

An input for an encoder includes a rectangular block with a size of (2B)×(2N−k)=64×111 bits. Input blocks of the encoder are numbered 0, 1, 2, and so on. Input information bits input to the encoder are ordered. The $i^{th}$ input bit is placed in the location of i % (64×111) in the encoded input block [i/(64×111)]. The input for the encoder is divided into 32×32 blocks.

A bit h in a $p^{th}$ row of a $P^{th}$ rectangular block input by the encoder is placed in a location (N+k) of a component code (2P+[p/B], p % B), where h=0, 1, 2, . . .

An output of the encoder is a rectangular block with a size of (2B)×N=64×128 bits. Output blocks of the encoder are numbered 0, 1, 2, and so on. A bit h in a $p^{th}$ row of a rectangular block P is a bit {2P+[p/B], [p/B], h/B, p % B} in the bit matrix, where h=0, 1, 2, . . . .

Figure 4:
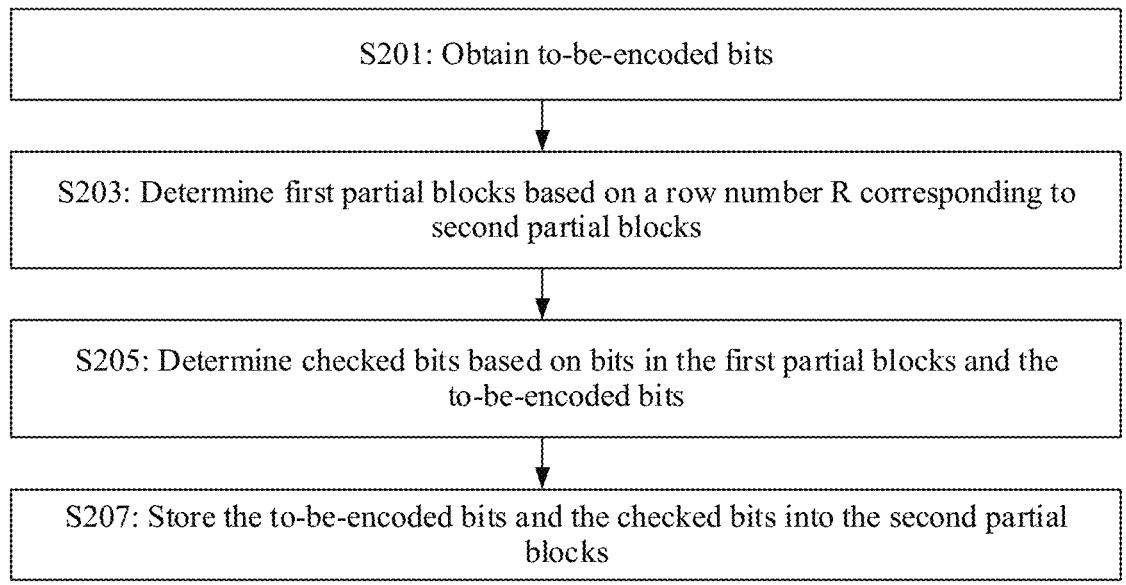
FIG. 4 is a schematic flowchart of an example of a communication method according to this disclosure.

FIG. 4 is a schematic flowchart of an encoding method according to this disclosure.

For ease of understanding and description, in the encoding method shown in FIG. 4, descriptions are provided by using an example of a process of encoding a component code in an $r^{th}$ row of a block that needs to be stored into an $R^{th}$ row of a block matrix, that is, second partial blocks are in an $R^{th}$ row in the encoding process in FIG. 4.

As shown in FIG. 4, in S201, an encoding device obtains bits (for example, Q bits) of to-be-encoded information or data.

In S203, the encoding device may determine, from the block matrix based on a value of R, first partial blocks corresponding to the second partial blocks. This process is similar to that in the descriptions of the "method and process for selecting the first partial blocks". To avoid repetition, detailed descriptions of this process are omitted herein.

For example, when a value of f(i, j) is obtained in manner a shown in Table 2, if R is an even number (that is, R % 2=0), the first partial blocks are the $1^{st}$ block in a $(54-51=3)^{rd}$ row of the block matrix, the $2^{nd}$ block in a $(54-47=7)^{th}$ row, the $3^{rd}$ block in a $(54-27=27)^{th}$ row, and the $4^{th}$ block in a $(54-13=41)^{st}$ row.

In S205, checked bits in the second partial blocks may be determined based on bits in the first partial blocks and bits (denoted as to-be-checked bits) in the second partial blocks. For example, the to-be-checked bits may be checked based on a check matrix, to generate the checked bits.

In S205, the Q bits and the checked bits may be filled in the second partial blocks.

It should be noted that, in S203, if a value of R is small, there may be a case in which the first partial blocks cannot be found in the block matrix. In this case, specified bits (for example, bits 0 or other non-zero bits) and bits in the second partial blocks may constitute the to-be-checked bits.

For example, when a component code generated by encoding currently input bits needs to be stored in a $1^{st}$ row of the bit matrix, or a component code generated by encoding currently input bits needs to be stored in a $1^{st}$ row of the block matrix, because the component code includes no first partial blocks, specified bits (for example, bits 0 or other non-zero bits) and the currently input to-be-encoded bits may constitute the to-be-checked bits.

For another example, in this disclosure, among a plurality of to-be-encoded bits that need to be stored into an $R^{th}$ row of a block matrix, a part of bits may be in first partial blocks, and the other part of blocks may be not in the first partial blocks. In this case, for the to-be-encoded bits in the first partial blocks, first symbols may be determined from the first partial blocks, the first symbols and the part of to-beencoded bits constitute the to-be-checked bits. For the other part of to-be-encoded bits that is not in the first partial blocks, specified bits (for example, 0 bits or other non-zero bits) and the other part of to-be-encoded bits may constitute the to-be-checked bits.

In addition, in this disclosure, a decoding action and process performed by a decoder side may correspond to an action performed by an encoder side. To avoid repetition, details of the decoding action and process are omitted herein. That is, in this disclosure, when the decoder side receives input to-be-decoded symbols (for example, to-be-decoded bits), if the decoder side learns that checked symbols in the to-be-decoded symbols are generated by the encoder side based on to-be-encoded symbols and first symbols corresponding to the to-be-encoded symbols, the decoder side determines the first symbols from a symbol matrix and restores the to-be-encoded symbols from the to-be-decoded symbols. In this disclosure, when the first symbols corresponding to the to-be-decoded bits are determined, the to-be-decoded symbols may be decoded based on the first symbols in a decoding scheme based on spatial coupling in a conventional technology.

Figure 5:
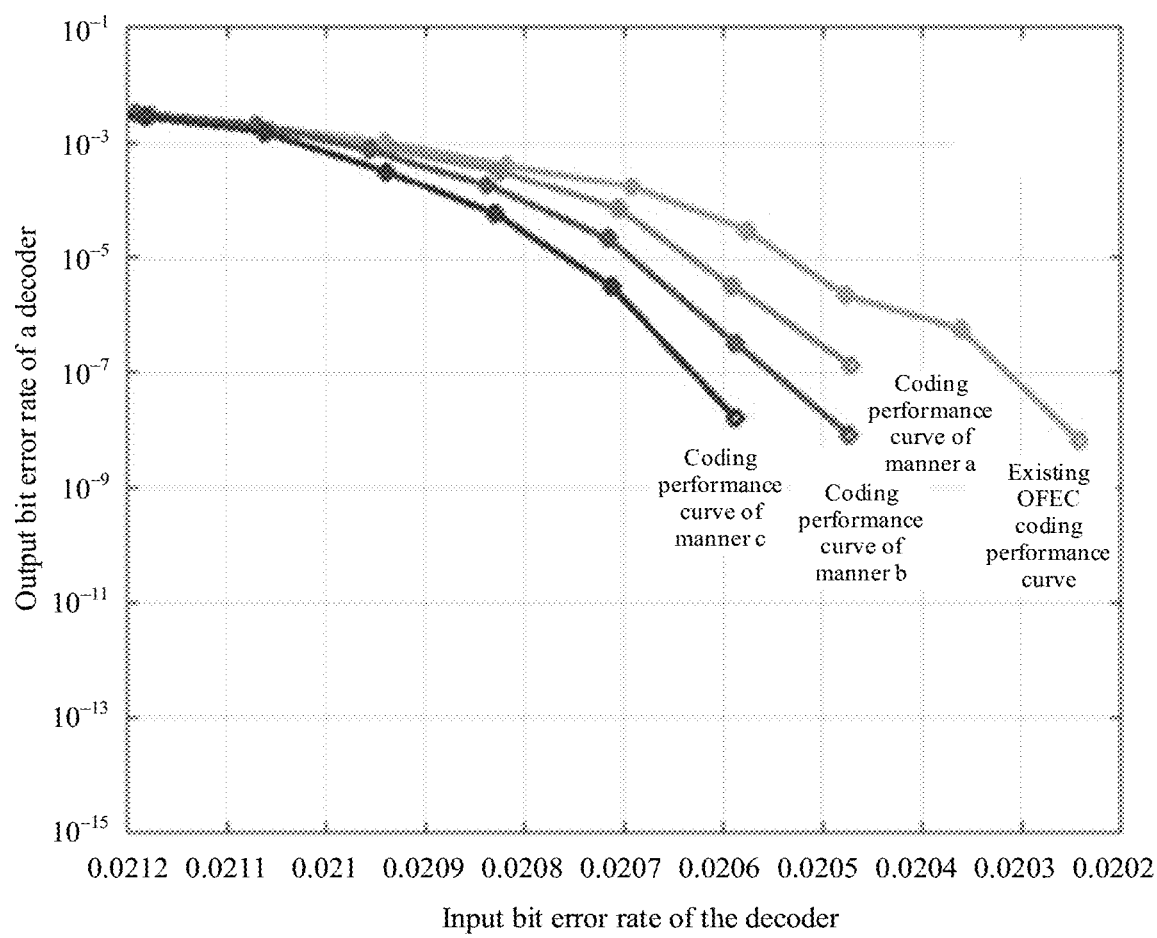
FIG. 5 is a schematic diagram of a simulation result of a communication method according to this disclosure.

FIG. 5 shows a comparison of simulation coding performance between the coding scheme provided in this disclosure and a coding scheme in the conventional technology. According to a simulation result in FIG. 5, a horizontal coordinate represents a bit error rate of an input by an FEC decoder, and a vertical coordinate represents a bit error rate that is after decoding by the FEC decoder. As shown in FIG. 5, when input bit error rates are the same, a bit error rate obtained after decoding based on this disclosure is obviously lower than a bit error rate obtained after decoding based on the conventional technology. In addition, open FEC (OFEC) performance of the coding scheme in the present disclosure tends to be better than that of the coding scheme in the conventional technology as an input bit error rate becomes smaller.

Table 6 shows a stall-pattern analysis result of a coding scheme in this embodiment of this disclosure, where the stall-patterns are a set of codeword locations, any codeword has (t+1) locations in the set, and t represents an error correction capability of a component code. As shown in Table 6, a stall-pattern feature of a codeword encoded based on a coding scheme in this embodiment of this disclosure is better than that of a codeword encoded based on the coding scheme in the conventional technology.

TABLE 6

| | 4 × 4 | 4 × 5 | 5 × 5 | 4 × 6 |
|---|---|---|---|---|
| Stall-pattern density per bit | | | | |
| Existing OFEC coding scheme | 1.2e+10 | 2.9e+11 | 5.5e+12 | 7.0e+12 |
| Coding scheme corresponding to manner a or manner b | 1.5e+9 | 4.3e+10 | 4.3e+11 | 1.6e+12 |
| Coding scheme corresponding to manner c | 2.0e+9 | 4.9e+10 | 5.1e+11 | 1.7e+12 |

In other words, according to the coding scheme provided in this embodiment of this disclosure, a short loop in a protograph can be reduced, a bit error rate of decoding can be reduced, and stall-pattern performance can be improved, thereby improving coding performance.

Figure 6:
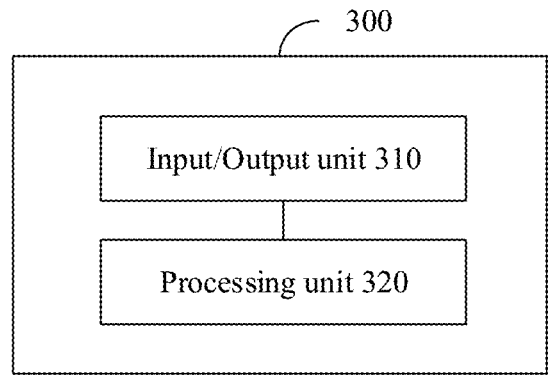
FIG. 6 is a schematic diagram of an example of a communication apparatus according to this disclosure.

FIG. 6 is a schematic block diagram of a communication apparatus according to an embodiment of this disclosure. The apparatus 300 includes an input/output unit 310 and a processing unit 320. The input/output unit 310 may receive information or data from an external device, and the input/output unit 310 may send information or data to the external device. The processing unit 320 is configured to process data, for example, perform channel coding. The input/output unit 310 may also be referred to as a communication interface or a communication unit.

Optionally, the apparatus 300 may further include a storage unit. The storage unit may be configured to store instructions and/or data. The processing unit 320 may read the instructions and/or the data in the storage unit.

The apparatus 300 may be configured to perform actions performed by the encoder side in the foregoing method embodiment. In this case, the apparatus 300 may be an encoder or a component that can be configured in an encoder. The processing unit 320 is configured to perform operations related to processing on the encoder side in the foregoing method embodiment.

Alternatively, the apparatus 300 may be configured to perform actions performed by the decoder side in the foregoing method embodiment. In this case, the apparatus 300 may be a decoder or a component that can be configured in a decoder. The processing unit 320 is configured to perform operations related to processing on a decoder side in the foregoing method embodiment.

In this disclosure, the apparatus 300 may be a communication device, or may be a chip (for example, an encoding chip or a decoding chip) configured in a communication device.

Figure 7:
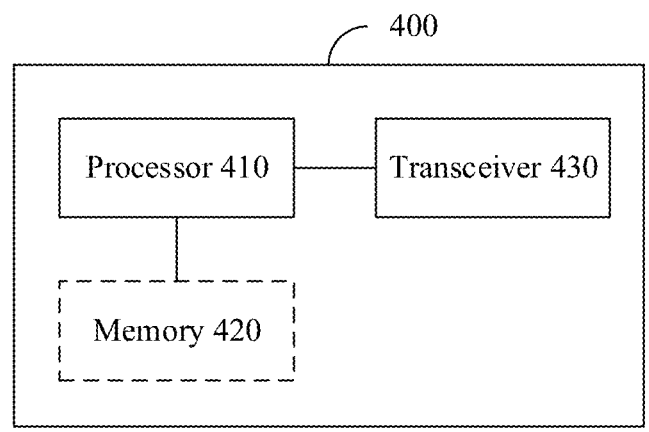
FIG. 7 is a schematic diagram of an example of a communication device according to this disclosure.

As shown in FIG. 7, an embodiment of this disclosure further provides a communication apparatus 400. The communication apparatus 400 includes a processor 410. The processor 410 is coupled to a memory 420. The memory 420 is configured to store a computer program or instructions and/or data. The processor 410 is configured to execute the computer program or the instructions and/or the data stored in the memory 420, so that the method in the foregoing method embodiment is executed.

Optionally, the communication apparatus 400 includes one or more processors 410.

Optionally, as shown in FIG. 7, the communication apparatus 400 may further include the memory 420.

Optionally, the communication apparatus 400 may include one or more memories 420.

Optionally, the memory 420 and the processor 410 may be integrated together, or may be separately disposed.

Optionally, as shown in FIG. 7, the wireless communication apparatus 400 may further include a transceiver 430. The transceiver 430 is configured to receive and/or send a signal. For example, the processor 410 is configured to control the transceiver 430 to receive and/or send a signal.

In a solution, the communication apparatus 400 is configured to perform the operations performed by the encoder-side device in the foregoing method embodiment.

For example, the processor 410 is configured to perform a processing-related operation performed by the encoder-side device in the foregoing method embodiment, and the transceiver 430 is configured to perform a receiving/sending-related operation performed by the encoder-side device in the foregoing method embodiment.

In another solution, the communication apparatus 400 is configured to perform the operations performed by the decoder-side device in the foregoing method embodiment.

For example, the processor 410 is configured to perform a processing-related operation performed by the decoder-side device in the foregoing method embodiment, and the transceiver 430 is configured to perform a receiving/sending-related operation performed by the decoder-side device in the foregoing method embodiment.

Figure 8:
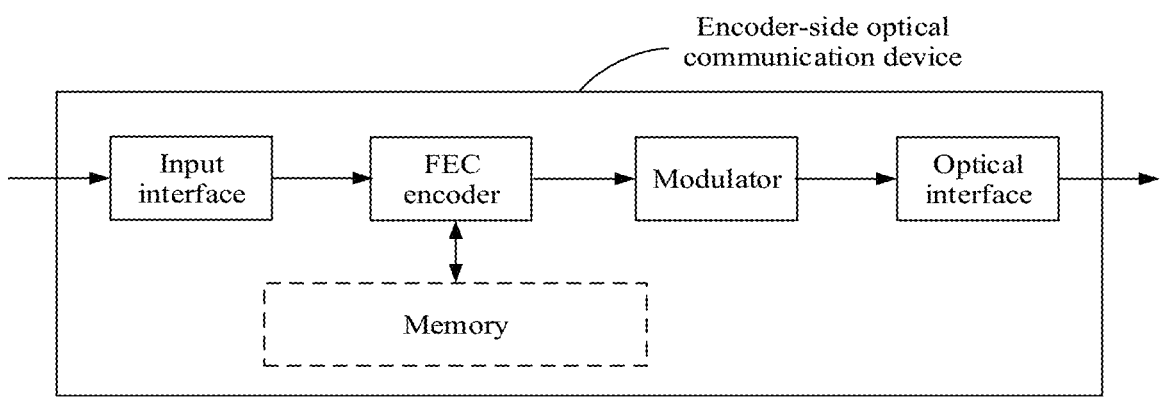
FIG. 8 is a schematic diagram of an example of an encoder-side optical communication device according to this disclosure.

FIG. 8 is a schematic diagram of an example of an encoder-side optical communication device according to this disclosure. As shown in FIG. 8, the encoder-side optical communication device may include an input interface, an FEC encoder, a memory, a modulator, and an optical interface.

The input interface is configured to obtain to-be-encoded symbols, the FEC encoder is configured to perform a process of determining first partial blocks in this disclosure, and the memory may be configured to store related information of a symbol matrix.

Figure 9:
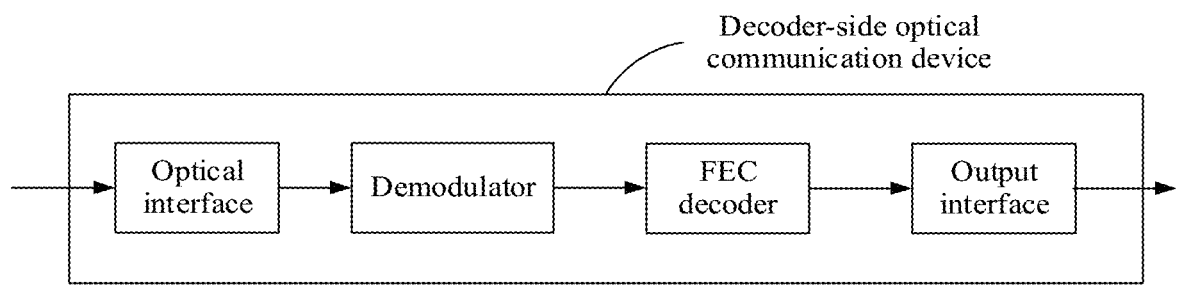
FIG. 9 is a schematic diagram of an example of a decoder-side optical communication device according to this disclosure.

FIG. 9 is a schematic diagram of an example of a decoder-side optical communication device according to this disclosure. As shown in FIG. 9, the decoder-side optical communication device may include an optical interface, a demodulator, an FEC decoder, and an output interface.

The optical interface is configured to obtain to-be-decoded symbols, and the FEC decoder is configured to perform a process of determining first partial blocks in this disclosure.

An embodiment of this disclosure further provides a computer-readable storage medium. The computer-readable storage medium stores computer instructions used to implement the method performed by the terminal device or the method performed by the network device in the foregoing method embodiment.

For example, when the computer program is executed by a computer, the computer is enabled to implement the method performed by the terminal device or the method performed by the network device in the foregoing method embodiment.

An embodiment of this disclosure further provides a computer program product including instructions. When the instructions are executed by a computer, the computer is enabled to implement the method performed by the terminal device or the method performed by the network device in the foregoing method embodiment.

An embodiment of this disclosure further provides a communication system. The communication system includes an encoder-side device and a decoder-side device in the foregoing embodiments.

For explanations and beneficial effects of related content of any communication apparatus provided above, refer to a corresponding method embodiment provided above. Details are not described herein again.

In embodiments of this disclosure, the communication device may include a hardware layer, an operating system layer running above the hardware layer, and an application layer running above the operating system layer. The hardware layer may include hardware such as a central processing unit (CPU), a memory management unit (MMU), and a memory (or a main memory). An operating system of the operating system layer may be any one or more of computer operating systems implementing service processing by using a process, for example, a LINUX operating system, a UNIX operating system, an ANDROID operating system, an IOS operating system, or a WINDOWS operating system. The application layer may include applications such as a browser, an address book, word processing software, and instant messaging software.

A specific structure of an execution body of the method provided in embodiments of this disclosure is not limited in embodiments of this disclosure, provided that a program that records code of the method provided in embodiments of this disclosure can be run to perform communication according to the method provided in embodiments of this disclosure. For example, the method provided in embodiments of this disclosure may be performed by an encoding device or a decoding device, or may be performed by a functional module that is in an encoding device or a decoding device and that can invoke and execute a program.

Aspects or features in embodiments of this disclosure may be implemented as a method, an apparatus, or a product that uses standard programming and/or engineering technologies. The term "product" used in this specification may cover a computer program that is accessible from any computer-readable device, carrier, or medium. For example, a computer-readable medium may include but is not limited to a magnetic storage device (for example, a hard disk, a floppy disk, or a magnetic tape), an optical disc (for example, a compact disc (CD) or a DIGITAL VERSATILE DISC (DVD)), a smart card, and a flash memory device (for example, an erasable programmable ROM (EPROM), a card, a stick, or a key drive).

Various storage media described in this specification may represent one or more devices and/or other machine-readable media that are configured to store information. The term "machine-readable media" may include but is not limited to a radio channel and various other media that can store, include, and/or carry instructions and/or data.

It should be understood that the processor mentioned in embodiments of this disclosure may be a CPU, or the processor may be another general-purpose processor, a digital signal processor (DSP), an application-specific integrated circuit (ASIC), a field-programmable gate array (FPGA), another programmable logic device, a discrete gate or transistor logic device, a discrete hardware component, or the like. The general-purpose processor may be a microprocessor, or the processor may be any conventional processor or the like.

It should also be understood that the memory in embodiments of this disclosure may be a volatile memory or a nonvolatile memory, or may include both a volatile memory and a nonvolatile memory. The nonvolatile memory may be a ROM, a programmable ROM (PROM), an EPROM, an electrically EPROM (EEPROM), or a flash memory. The volatile memory may be a random-access memory (RAM). For example, the RAM may be used as an external cache. By way of example but not limitation, the RAM may include a plurality of forms in the following: a static RAM (SRAM), a dynamic RAM (DRAM), a synchronous DRAM (SDRAM), a double data rate (DDR) SDRAM, an enhanced SDRAM (ESDRAM), a synchlink DRAM (SLDRAM), and a direct rambus (DR) RAM.

It should be noted that when the processor is a general-purpose processor, a DSP, an ASIC, an FPGA, another programmable logic device, a discrete gate or a transistor logic device, or a discrete hardware component, the memory (storage module) may be integrated into the processor.

It should also be noted that the memories described in this specification are intended to include, but are not limited to, these and any other suitable types of memories.

A person of ordinary skill in the art should easily be aware that, in combination with the examples described in embodiments disclosed in this specification, the units and algorithm steps can be implemented by electronic hardware or a combination of computer software and electronic hardware. Whether the functions are performed by hardware or software depends on particular applications and design constraints of the technical solutions. A person skilled in the art may use different methods to implement the described functions for each particular application, but it should not be considered that the implementation goes beyond the scope of embodiments of this disclosure.

It may be clearly understood by a person skilled in the art that, for the purpose of convenient and brief description, for a detailed working process of the foregoing system, apparatus, and unit, refer to a corresponding process in the foregoing method embodiment. Details are not described herein again.

In the several embodiments provided in embodiments of this disclosure, it should be understood that the disclosed system, apparatus, and method may be implemented in other manners. For example, the apparatus embodiment described above are merely examples. For example, division into the units is merely logical function division and may be other division during actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electrical, mechanical, or other forms.

The units described as separate parts may or may not be physically separate. Components displayed as units may or may not be physical units, and may be located in one location or may be distributed on a plurality of network units. A part or all of the units may be selected based on actual requirements to achieve the objectives of the solutions in embodiments.

In addition, functional units in embodiments of this disclosure may be integrated into one processing unit, or each of the units may exist alone physically, or two or more units are integrated into one unit.

When the functions are implemented in a form of a software functional unit and sold or used as an independent product, the functions may be stored in a computer-readable storage medium. Based on such an understanding, the technical solutions of embodiments of this disclosure essentially, or the part contributing to the other approaches, or a part of the technical solutions may be implemented in a form of a software product. The computer software product is stored in a storage medium, and includes several instructions for instructing a computer device (which may be a personal computer, a server, a network device, or the like) to perform all or a part of the steps of the methods described in embodiments of this disclosure. The foregoing storage medium includes any medium that can store program code, for example, a Universal Serial Bus (USB) flash drive, a removable hard disk, a ROM, a RAM, a magnetic disk, or an optical disc.

The foregoing descriptions are merely specific implementations of this disclosure, but are not intended to limit the protection scope of this disclosure. Any variation or replacement readily figured out by a person skilled in the art within the technical scope disclosed in embodiments of this disclosure shall fall within the protection scope of this disclosure. Therefore, the protection scope of this disclosure shall be subject to the protection scope of the claims.

What is claimed is:

1. A communication method comprising:
   obtaining a plurality of to-be-encoded symbols;
   determining, from a symbol matrix and based on a value of a row number R, a plurality of first partial blocks corresponding to a plurality of second partial blocks, wherein the symbol matrix comprises a plurality of rows of second symbols and a plurality of columns of the second symbols, wherein the second symbols constitute a plurality of first blocks, wherein the first blocks constitute a block matrix, wherein each of the first blocks comprises B rows of the second symbols and B columns of the second symbols, wherein a plurality of first symbols comprise symbols in the first partial blocks in the block matrix, wherein the first partial blocks are grouped into at least one block group, wherein a first difference between row numbers of a first pair of blocks in a first block group of the at least one block group is not the same as a second difference between row numbers of a second pair of blocks in the first block group, and wherein B is an integer greater than or equal to 1;
   performing check processing on the first symbols and the to-be-encoded symbols;
   generating checked symbols based on the check processing on the first symbols and the to-be-encoded symbols for improved coding performance; and
   storing the checked symbols in the second partial blocks.

2. The communication method of claim 1, further comprising storing the to-be-encoded symbols and the checked symbols into a plurality of third blocks, wherein the third blocks are in a same row of the block matrix.

3. The communication method of claim 1, wherein a third block corresponding to a first to-be-encoded symbol in the to-be-encoded symbols satisfies the following condition:

$$P=R-f(R\% \ 2,[h/B]),$$

wherein $$f(i, j) = \begin{cases} (a_{L-j} - b - 1) \cdot 2 + 1, i = 0 \\ (b - a_{j+1}) \cdot 2 + 1, i = 1 \end{cases},$$

wherein P represents a third row number of the third block, wherein R represents a fourth row number, in the block matrix, of a fourth block into the first to-be-encoded symbol to be stored, wherein h represents a column number of the first to-be-encoded symbol in the symbol matrix, wherein [ ] represents a rounding down operation, wherein a is comprised in an integer set A, wherein L represents a quantity of integers comprised in the integer set A, wherein a third difference between first two integers in the set A is not the same as a fourth difference between second two integers in the set A, and wherein % represents a modulus.

4. The communication method of claim 3, further comprising determining, based on an integer set A', the integer set A, wherein a quantity of integers comprised in the integer set A' (W) and the integers comprised in the integer set A' satisfy a correspondence.

5. The communication method of claim 3, further comprising generating, based on an integer set A'={$a_1, a_2, \ldots, a_l, \ldots, a_W$}, the integer set A, wherein W and the integer set A' satisfy a correspondence, and wherein the integer set A satisfies the following condition:

$$A=\{a_L-a_l | 1 \leq l \leq L\}.$$

6. The communication method of claim 3, further comprising:
   generating, based on an integer set A'={$a_1, a_2, \ldots, a_l, \ldots, a_W$}, the integer set A, wherein W and the integer set A' satisfy a correspondence; or
   determining, based on the integer set A', an integer set A''={$a_L-a_l | 1 \leq l \leq L$} and generating, based on the integer set A'', the integer set A, wherein the integer set A satisfies the following condition:

$$A=\{a_1, a_2, \ldots, a_S, \Delta+a_{S+1}, \Delta+a_{S+2}, \ldots, \Delta+a_{2-S}\},$$

wherein S represents a quantity of columns comprised in the block matrix,
wherein 2·S=L, and
wherein Δ is a positive integer.

7. The communication method of claim 3, further comprising:
determining, based on an integer set A'={$a_1, a_2, \ldots, a_I, \ldots, a_W$}, an integer set A"={$a_L-a_l | 1 \leq l \leq L$}, wherein W and the integer set A' satisfy a correspondence;
generating, based on the integer set A' or the integer set A", an integer set A'''={$a_1, a_2, \ldots, a_S, \Delta+a_{S+1}, \Delta+a_{S+2}, \ldots, \Delta+a_{2-S}$}, wherein S represents a quantity of columns comprised in the block matrix, wherein 2·S=L, and wherein Δ is a positive integer;
generating, based on any one of the integer set A', the integer set A", or the integer set A''', an integer set $A_1=\{a_1^{(1)}, a_2^{(1)}, \ldots, a_{L_1}^{(1)}\}$; and
generating, based on any one of the integer set A', the integer set A", or the integer set A''', an integer set $A_2=\{a_1^{(2)}, a_2^{(2)}, \ldots, a_{L_2}^{(2)}\}$,
wherein the integer set A satisfies the following condition:

$$A=\{a_1^{(1)}, a_2^{(1)}, \ldots, a_L^{(1)}, \delta+a_1^{(2)}, \delta+a_2^{(2)}, \ldots, \delta+a_{L_2}^{(2)}\},$$

wherein δ is an integer greater than $a_{L_1}^{(1)}$, and
wherein $L_1+L_2=L$.

8. The communication method of claim 3, wherein:
f(R % 2, [k/B])=51 when R % 2=0 and [k/B]=0;
f(R % 2, [k/B])=47 when R % 2=0 and [k/B]=1;
f(R % 2, [k/B])=27 when R % 2=0 and [k/B]=2;
f(R % 2, [k/B])=13 when R % 2=0 and [k/B]=3;
f(R % 2, [k/B])=41 when R % 2=1 and [k/B]=0;
f(R % 2, [k/B])=39 when R % 2=1 and [k/B]=1;
f(R % 2, [k/B])=33 when R % 2=1 and [k/B]=2; and
f(R % 2, [k/B])=23 when R % 2=1 and [k/B]=3.

9. The communication method of claim 3, wherein:
f(R % 2, [k/B])=31 when R % 2=0 and [k/B]=0;
f(R % 2, [k/B])=29 when R % 2=0 and [k/B]=1;
f(R % 2, [k/B])=25 when R % 2=0 and [k/B]=2;
f(R % 2, [k/B])=13 when R % 2=0 and [k/B]=3;
f(R % 2, [k/B])=45 when R % 2=1 and [k/B]=0;
f(R % 2, [k/B])=35 when R % 2=1 and [k/B]=1;
f(R % 2, [k/B])=21 when R % 2=1 and [k/B]=2; and
f(R % 2, [k/B])=13 when R % 2=1 and [k/B]=3.

10. The communication method of claim 3, wherein:
f(R % 2, [k/B])=25 when R % 2=0 and [k/B]=0;
f(R % 2, [k/B])=23 when R % 2=0 and [k/B]=1;
f(R % 2, [k/B])=17 when R % 2=0 and [k/B]=2;
f(R % 2, [k/B])=13 when R % 2=0 and [k/B]=3;
f(R % 2, [k/B])=25 when R % 2=1 and [k/B]=0;
f(R % 2, [k/B])=23 when R % 2=1 and [k/B]=1;
f(R % 2, [k/B])=17 when R % 2=1 and [k/B]=2; and
f(R % 2, [k/B])=13 when R % 2=1 and [k/B]=3.

11. A communication device comprising:
a memory configured to store instructions; and
one or more processors coupled to the memory and configured to execute the instructions to cause the communication device to:
obtain a plurality of to-be-encoded symbols;
determine, from a symbol matrix and based on a value of a row number R, a plurality of first partial blocks corresponding to a plurality of second partial blocks, wherein the symbol matrix comprises a plurality of rows of second symbols and a plurality of columns of the second symbols, wherein the second symbols constitute a plurality of first blocks, wherein the first blocks constitute a block matrix, wherein each of the first blocks comprises B rows of the second symbols and B columns of the second symbols, wherein a plurality of first symbols comprise symbols the first partial blocks in the block matrix, wherein the first partial blocks are grouped into at least one block group, wherein a first difference between row numbers of a first pair of blocks in a first block group of the at least one block group is not the same as a second difference between row numbers of a second pair of blocks in the first block group, and wherein B is an integer greater than or equal to 1;
perform check processing on the first symbols and the to-be-encoded symbols;
generate checked symbols based on the check processing on the first symbols and the to-be-encoded symbols for improved coding performance; and
store the checked symbols in the second partial blocks.

12. The communication device of claim 11, wherein the one or more processors are further configured to execute the instructions to cause the communication device to store the to-be-encoded symbols and the checked symbols into a plurality of third blocks, and wherein the third blocks are in a same row of the block matrix.

13. The communication device of claim 11, wherein a third block corresponding to a first to-be-encoded symbol in the to-be-encoded symbols satisfies the following condition:

$$P=R-f(R\% 2,[h/B]),$$

wherein $$f(i,j) = \begin{cases} (a_{L-j}-b-1)\cdot 2+1, i=0 \\ (b-a_{j+1})\cdot 2+1, i=1 \end{cases},$$

wherein P represents a third row number of the third block, wherein R represents a fourth row number, in the block matrix, of a fourth block into the first to-be-encoded symbol to be stored, wherein h represents a column number of the first to-be-encoded symbol in the symbol matrix, wherein [ ] represents a rounding down operation, wherein a is comprised in an integer set A, wherein L represents a quantity of integers comprised in the integer set A, wherein a third difference between first two integers in the integer set A is not the same as a fourth difference between second two integers in the integer set A, and wherein % represents a modulus.

14. The communication device of claim 13, wherein the one or more processors are further configured to execute the instructions to cause the communication device to determine, based on an integer set A', the integer set A, wherein a quantity of integers comprised in the integer set A' (W) and the integers comprised in the integer set A' satisfy a correspondence.

15. The communication device of claim 13, wherein the one or more processors are further configured to execute the instructions to cause the communication device to generate, based on an integer set A'={$a_1, a_2, \ldots, a_I, \ldots, a_W$} the integer set A, wherein W and the integer set A' satisfy a correspondence, and wherein the integer set A satisfies the following condition:

$$A=\{a_L-a_l | 1 \leq l \leq L\}.$$

16. The communication device of claim 13, wherein the one or more processors are further configured to execute the instructions to cause the communication device to:
- generating, based on an integer set $A'=\{a_1, a_2, \ldots, a_l, \ldots, a_W\}$, the integer set A, wherein W and the integer set A' satisfy a correspondence; or
- determining, based on the integer set A', an integer set $A''=\{a_L-a_l | 1 \leq l \leq L\}$ and generating, based on the integer set A'', the integer set A, wherein the integer set A satisfies the following condition:

$$A=\{a_1, a_2, \ldots, a_S, \Delta+a_{S+1}, \Delta+a_{S+2}, \ldots, \Delta+a_{2-S}\},$$

wherein S represents a quantity of columns comprised in the block matrix,
wherein $2 \cdot S = L$, and
wherein $\Delta$ is a positive integer.

17. The communication device of claim 13, wherein the one or more processors are further configured to execute the instructions to cause the communication device to:
- determining, based on an integer set $A'=\{a_1, a_2, \ldots, a_l, \ldots, a_W\}$, an integer set $A''=\{a_L-a_l | 1 \leq l \leq L\}$, wherein W and the integer set A' satisfy a correspondence;
- generating, based on the integer set A' or the integer set A'', an integer set $A'''=\{a_1, a_2, \ldots, a_S, \Delta+a_{S+1}, \Delta+a_{S+2}, \ldots, \Delta+a_{2-S}\}$, wherein S represents a quantity of columns comprised in the block matrix, wherein $2 \cdot S = L$, and wherein $\Delta$ is a positive integer;
- generating, based on any one of the integer set A', the integer set A'', or the integer set A''', an integer set $A_1 = \{a_1^{(1)}, a_2^{(1)}, \ldots, a_{L_1}^{(1)}\}$; and
- generating, based on any one of the integer set A', the integer set A'', or the integer set A''', an integer set $A_2 = \{a_1^{(2)}, a_2^{(2)}, \ldots, a_{L_2}^{(1)}\}$, wherein the integer set A satisfies the following condition:

$$A=\{a_1^{(1)}, a_2^{(1)}, \ldots, a_L^{(1)}, \delta+a_1^{(2)}, \delta+a_2^{(2)}, \ldots, \delta+a_{L_2}^{(2)}\},$$

wherein $\delta$ is an integer greater than $a_{L_1}^{(1)}$, and
wherein $L_1 + L_2 = L$.

18. The communication device of claim 13, wherein:
f(R % 2, [k/13])=51 when R % 2=0 and [k/B]=0;
f(R % 2, [k/13])=47 when R % 2=0 and [k/B]=1;
f(R % 2, [k/13])=27 when R % 2=0 and [k/B]=2;
f(R % 2, [k/B])=13 when R % 2=0 and [k/B]=3;
f(R % 2, [k/B])=41 when R % 2=1 and [k/B]=0;
f(R % 2, [k/B])=39 when R % 2=1 and [k/B]=1;
f(R % 2, [k/B])=33 when R % 2=1 and [k/B]=2; and
f(R % 2, [k/B])=23 when R % 2=1 and [k/B]=3.

19. The communication device of claim 13, wherein:
f(R % 2, [k/B])=31 when R % 2=0 and [k/B]=0;
f(R % 2, [k/B])=29 when R % 2=0 and [k/B]=1;
f(R % 2, [k/B])=25 when R % 2=0 and [k/B]=2;
f(R % 2, [k/B])=13 when R % 2=0 and [k/B]=3;
f(R % 2, [k/B])=45 when R % 2=1 and [k/B]=0;
f(R % 2, [k/B])=35 when R % 2=1 and [k/B]=1;
f(R % 2, [k/B])=21 when R % 2=1 and [k/B]=2; and
f(R % 2, [k/B])=13 when R % 2=1 and [k/B]=3.

20. The communication device of claim 13, wherein:
f(R % 2, [k/B])=25 when R % 2=0 and [k/B]=0;
f(R % 2, [k/B])=23 when R % 2=0 and [k/B]=1;
f(R % 2, [k/B])=17 when R % 2=0 and [k/B]=2;
f(R % 2, [k/B])=13 when R % 2=0 and [k/B]=3;
f(R % 2, [k/B])=25 when R % 2=1 and [k/B]=0;
f(R % 2, [k/B])=23 when R % 2=1 and [k/B]=1;
f(R % 2, [k/B])=17 when R % 2=1 and [k/B]=2; and
f(R % 2, [k/B])=13 when R % 2=1 and [k/B]=3.

\* \* \* \* \*

UNITED STATES PATENT AND TRADEMARK OFFICE
CERTIFICATE OF CORRECTION

PATENT NO. : 11,848,776 B2
APPLICATION NO. : 17/870413
DATED : December 19, 2023
INVENTOR(S) : Hongchen Yu et al.

Page 1 of 1

It is certified that error appears in the above-identified patent and that said Letters Patent is hereby corrected as shown below:

In the Claims

Claim 6, Column 33, Line 2: "$\Delta + a_{2\text{-}s}$" should read "$\Delta + a_{2 \cdot s}$"

Claim 7, Column 33, Line 15: "$\Delta + a_{2\text{-}s}$" should read "$\Delta + a_{2 \cdot s}$"

Claim 7, Column 33, Line 25: "$a_L^{(1)}$" should read "$a_{L1}^{(1)}$"

Claim 16, Column 35, Line 11: "$\Delta + a_{2\text{-}s}$" should read "$\Delta + a_{2 \cdot s}$"

Claim 17, Column 35, Line 20: "determining, based" should read "determine, based"

Claim 17, Column 35, Line 24: "generating, based" should read "generate, based"

Claim 17, Column 35, Line 26: "$\Delta + a_{2\text{-}s}$" should read "$\Delta + a_{2 \cdot s}$"

Claim 17, Column 35, Line 29: "generating, based" should read "generate, based"

Claim 17, Column 35, Line 32: "generating, based" should read "generate, based"

Claim 17, Column 35, Line 34: "$a_{L2}^{(1)}$" should read "$a_{L2}^{(2)}$"

Claim 18, Column 36, Line 7: "[k/13]" should read "[k/B]"

Claim 18, Column 36, Line 8: "[k/13]" should read "[k/B]"

Claim 18, Column 36, Line 9: "[k/13]" should read "[k/B]"

Signed and Sealed this
Twentieth Day of February, 2024

*Katherine Kelly Vidal*
*Director of the United States Patent and Trademark Office*